(12) United States Patent
Jung et al.

(10) Patent No.: US 10,330,971 B2
(45) Date of Patent: Jun. 25, 2019

(54) DISPLAY APPARATUS, ELECTRONIC DEVICE INCLUDING THE SAME, AND OPERATING METHOD THEREOF

(71) Applicant: SAMSUNG ELECTRONICS CO., LTD., Suwon-si, Gyeonggi-do (KR)

(72) Inventors: Song Hee Jung, Suwon-si (KR); Jin Hong Jeong, Yongin-si (KR); Youngdo Kim, Gwacheon-si (KR); Joohyun Kim, Seoul (KR); Taesung Kim, Seongnam-si (KR); Hyunchang Shin, Seongnam-si (KR); Hunhee Lee, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/481,812

(22) Filed: Apr. 7, 2017

(65) Prior Publication Data

US 2017/0293181 A1    Oct. 12, 2017

(30) Foreign Application Priority Data

Apr. 7, 2016    (KR) .......................... 10-2016-0042761

(51) Int. Cl.
*G02F 1/133*    (2006.01)
*G02F 1/155*    (2006.01)
(Continued)

(52) U.S. Cl.
CPC .... *G02F 1/133512* (2013.01); *G02F 1/13318* (2013.01); *G02F 1/133514* (2013.01);
(Continued)

(58) Field of Classification Search
CPC ........... G02F 1/133512; G02F 1/13318; G02F 1/136209; G02F 1/136286; G02F 1/155;
(Continued)

(56) References Cited

U.S. PATENT DOCUMENTS 9,170,468 B2    10/2015   Lin et al.
9,857,510 B2 *   1/2018   Yi .......................... G02B 5/223
(Continued)

FOREIGN PATENT DOCUMENTS

JP       2014-063143       4/2014
KR    10-2010-0130396     12/2010
(Continued)

OTHER PUBLICATIONS

Search Report and Written Opinion dated Jul. 14, 2017 in counterpart International Patent Application No. PCT/KR2017/003833.
(Continued)

*Primary Examiner* — Nathanael R Briggs
(74) *Attorney, Agent, or Firm* — Nixon & Vanderhye P.C.

(57) ABSTRACT

A display apparatus, an electronic device including the same, and an operating method thereof are disclosed. The display apparatus may include: a window layer configured to contribute to at least one outward appearance of the display apparatus; a pixel layer including at least one pixel configured to display graphic information received from a processor that is functionally connected to the display apparatus, a driving wiring that drives the pixel, and a Black Matrix (BM) disposed in a BM area that does not include the at least one pixel; and a color layer disposed in at least one direction of the pixel layer, and configured to allow a designated color to be exposed to an outside through the window layer when the at least one pixel does not operate, wherein the pixel layer may include: a first substrate including a first plane facing a first direction, and a second plane facing a second direction opposite the first direction; and a pixel electrode, a light-emitter, a cathode, and a second substrate disposed between the first plane of the first substrate and the window layer, and wherein the color layer may be disposed in the BM area.

20 Claims, 28 Drawing Sheets

(51) Int. Cl.
   *H01L 27/32* (2006.01)
   *H01L 51/52* (2006.01)
   *G02F 1/1335* (2006.01)
   *G02F 1/1362* (2006.01)

(52) U.S. Cl.
   CPC .. *G02F 1/136209* (2013.01); *G02F 1/136286* (2013.01); *G02F 1/155* (2013.01); *H01L 27/322* (2013.01); *H01L 27/3225* (2013.01); *H01L 51/5284* (2013.01)

(58) Field of Classification Search
   CPC ............ G02F 1/133514; H01L 27/322; H01L 27/3225; H01L 51/5284
   See application file for complete search history.

(56) References Cited

U.S. PATENT DOCUMENTS

| | | | |
|---|---|---|---|
| 2002/0027229 | A1 | 3/2002 | Yamazaki et al. |
| 2008/0218670 | A1* | 9/2008 | Kumai .............. G02F 1/133555 349/114 |
| 2012/0032178 | A1 | 2/2012 | Imai et al. |
| 2014/0153100 | A1 | 6/2014 | Yi |
| 2015/0048348 | A1* | 2/2015 | Huang ................... H01L 27/322 257/40 |
| 2015/0131036 | A1 | 5/2015 | Yu et al. |
| 2015/0318339 | A1* | 11/2015 | Nakamura .......... H01L 27/3262 257/98 |
| 2015/0318447 | A1 | 11/2015 | Choi |
| 2016/0079311 | A1 | 3/2016 | Lim et al. |

FOREIGN PATENT DOCUMENTS

| | | |
|---|---|---|
| KR | 10-2015-0002247 | 1/2015 |
| KR | 10-2015-0055169 | 5/2015 |

OTHER PUBLICATIONS

Extended European Search Report dated Feb. 19, 2019 for EP Application No. 17779391.6.

* cited by examiner

DISPLAY APPARATUS, ELECTRONIC DEVICE INCLUDING THE SAME, AND OPERATING METHOD THEREOF

CROSS-REFERENCE TO RELATED APPLICATION

This application is based on and claims priority under 35 U.S.C. § 119 to Korean Application Serial No. 10-2016-0042761, which was filed in the Korean Intellectual Property Office on Apr. 7, 2016, the content of which is incorporated by reference herein in its entirety.

TECHNICAL FIELD

The present disclosure relates generally to a display apparatus, an electronic device including the same, and an operating method thereof.

BACKGROUND

Typically, an electronic device has various functions added thereto and performs the functions in combination. For example, an electronic device may perform a mobile communication function, a data communication function, an image-capturing function, a voice recording function, and the like. The electronic device may display pieces of content related to various functions through a display apparatus.

However, when a display apparatus is in a display-off state, the display apparatus displays only a black color, and a user may get an unattractive aesthetic impression of an electronic product.

SUMMARY

Various example embodiments of the present disclosure provide a display apparatus, an electronic device including the same, and an operating method thereof.

The technical problems addressed in the present disclosure are not limited to the aforementioned technical problems, and other technical problems, which are not mentioned, can be clearly understood from the following description by those having ordinary knowledge in the technical field to which the present disclosure pertains.

In accordance with an example aspect of the present disclosure, a display apparatus is provided. The display apparatus may include: a window layer configured to contribute to at least one outward appearance of the display apparatus; a pixel layer including at least one pixel configured to display graphic information received from a processor that is functionally connected to the display apparatus, a driving wiring that drives the pixel, and a Black Matrix (BM) disposed in a BM area that does not include the at least one pixel; and a color layer disposed in at least one direction of the pixel layer, and configured to allow a designated color to be exposed to an outside through the window layer when the at least one pixel does not operate, wherein the pixel layer may include: a first substrate including a first plane facing a first direction, and a second plane facing a second direction opposite the first direction; and a pixel electrode, a light-emitting element (light-emitter), a cathode, and a second substrate disposed between the first plane of the first substrate and the window layer, and wherein the color layer may be disposed in the BM area.

In accordance with another example aspect of the present disclosure, a display apparatus is provided. The display apparatus may include: a window layer configured to contribute to at least one outward appearance of the display apparatus; a pixel layer including at least one pixel configured to display graphic information received from a processor that is functionally connected to the display apparatus; and a color layer disposed in at least one direction of the pixel layer, and configured to allow a designated color to be exposed to an outside through the window layer when the at least one pixel does not operate.

In accordance with still another example aspect of the present disclosure, an electronic device is provided. The electronic device may include: a display apparatus; and a processor functionally connected to the display apparatus, wherein the display apparatus may include: a window layer configured to contribute to at least one outward appearance of the display apparatus; a pixel layer including at least one pixel configured to display graphic information received from the processor that is functionally connected to the display apparatus; and a color layer disposed in at least one direction of the pixel layer, and configured to allow a designated color to be exposed to an outside through the window layer when the at least one pixel does not operate, wherein the color layer may further comprise a pattern-formation layer configured to refract light reflected by the color layer, wherein the pattern-formation layer may include at least one of: a lens, a fine particle material, metal powder, and a bead.

In accordance with yet another example aspect of the present disclosure, a method of operating a display apparatus is provided. The operating method may include: sensing an illuminance; correcting a pixel of a light-emitting element based on the sensed illuminance; and outputting light to the corrected pixel, wherein a color layer configured to be disposed in at least one direction and to have a predetermined color so as to correspond to the light-emitting elements may be included.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

DETAILED DESCRIPTION

Figure 1:
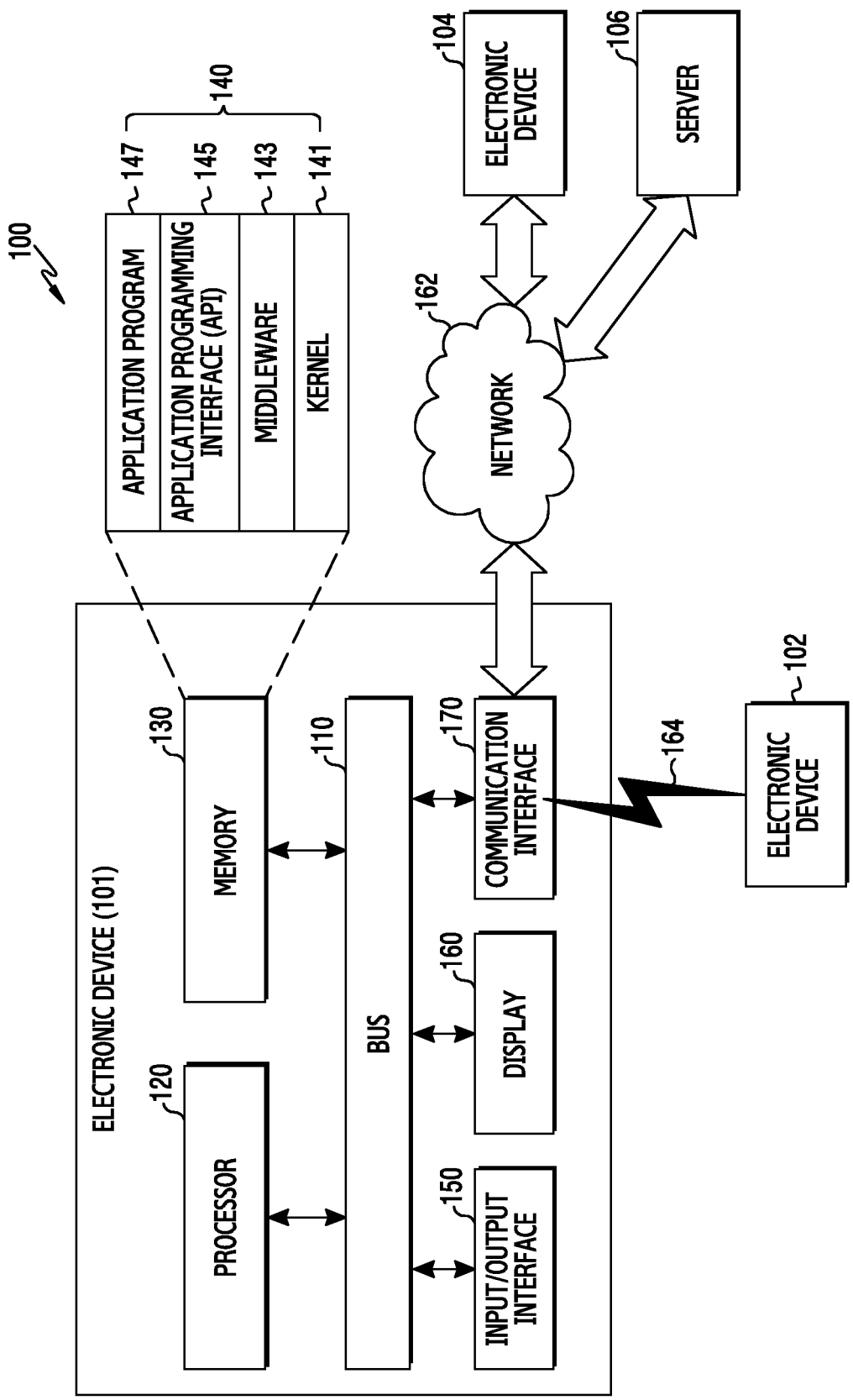
FIG. 1 is a diagram illustrating an example network environment including an example electronic device according to various example embodiments of the present disclosure.

Hereinafter, various example embodiments of the present disclosure will be described with reference to the accompanying drawings. However, it should be understood that there is no intent to limit the present disclosure to the particular forms disclosed herein; rather, the present disclosure should be understood to cover various modifications, equivalents, and/or alternatives of the various example embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposed between them. On the other hand, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may refer, for example, to a situation in which the device, together with other devices or components, "is able to". For example, the phrase "processor adapted (or configured) to perform A, B, and C" may refer, for example, to a dedicated processor (e.g. embedded processor) for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even when the term is defined in the present disclosure, it should not be interpreted to exclude embodiments of the present disclosure.

An electronic device according to various example embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device, or the like, but is not limited thereto. According to various example embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto.

According to some example embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame, or the like, but is not limited thereto.

According to another example embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some example embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter), or the like, but is not limited thereto. The electronic device according to various example embodiments of the present disclosure may be a combination of one or more of the aforementioned various devices. The electronic device according to some embodiments of the present disclosure may be a flexible device. Further, the electronic device according to an example embodiment of the present disclosure is not limited to the aforementioned devices, and may include a new electronic device according to the development of technology.

Hereinafter, an electronic device according to various example embodiments will be described with reference to the accompanying drawings. As used herein, the term "user" may indicate a person who uses an electronic device or a device (e.g., an artificial intelligence electronic device) that uses an electronic device.

FIG. 1 is a diagram illustrating an example network environment including an example electronic device according to various example embodiments of the present disclosure.

An electronic device 101 within a network environment 100, according to various embodiments, will be described with reference to FIG. 1. The electronic device 101 may include a bus 110, a processor (e.g., including processing circuitry) 120, a memory 130, an input/output interface (e.g., including interface circuitry) 150, a display 160, and a communication interface (e.g., including communication circuitry) 170. In some embodiments, the electronic device 101 may omit at least one of the above elements or may further include other elements.

The bus 110 may include, for example, a circuit for connecting the elements 110-170 and transferring communication (e.g., control messages and/or data) between the elements.

The processor 120 may include various processing circuitry, such as, for example, and without limitation, one or more of a dedicated processor, a Central Processing Unit (CPU), an Application Processor (AP), and a Communication Processor (CP). The processor 120, for example, may carry out operations or data processing relating to control and/or communication of at least one other element of the electronic device 101.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data.

In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may include various interface circuitry and function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display, or the like, but is not limited thereto. The display 160, for example, may display various types of content (e.g., text, images, videos, icons, or symbols) for the user. The display 160 may include a touch screen and receive, for example, a touch, gesture, proximity, or hovering input using an electronic pen or the user's body part.

The communication interface 170, for example, may include various communication circuitry and set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106).

The wireless communication may use at least one of, for example, Long Term Evolution (LTE), LTE-Advance (LTE-A), Code Division Multiple Access (CDMA), Wideband CDMA (WCDMA), Universal Mobile Telecommunications System (UNITS), WiBro (Wireless Broadband), and Global System for Mobile Communications (GSM), as a cellular communication protocol. In addition, the wireless communication may include, for example, short range communication 164. The short-range communication 164 may be performed by using at least one of, for example, Wi-Fi, Bluetooth, Bluetooth low energy (BLE), Near Field Communication (NFC), and Global Navigation Satellite System (GNSS). The GNSS may include at least one of, for example, a Global Positioning System (GPS), a Global Navigation Satellite System (Glonass), a Beidou Navigation Satellite System (hereinafter referred to as "Beidou"), and a European Global Satellite-based Navigation System (Galileo), according to a use area, a bandwidth, or the like. Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one of a communication network such as a computer network (e.g., a LAN or a WAN), the Internet, and a telephone network.

Each of the first and second external electronic apparatuses 102 and 104 may be of a type identical to or different from that of the electronic apparatus 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic apparatus may execute the requested functions or the additional functions, and may deliver a result of the execution to the electronic apparatus 101. The electronic device 101 may process the received result as it is or additionally to provide the requested functions or services. To achieve this, for example, cloud computing, distributed computing, or client-server computing technology may be used.

Figure 2:
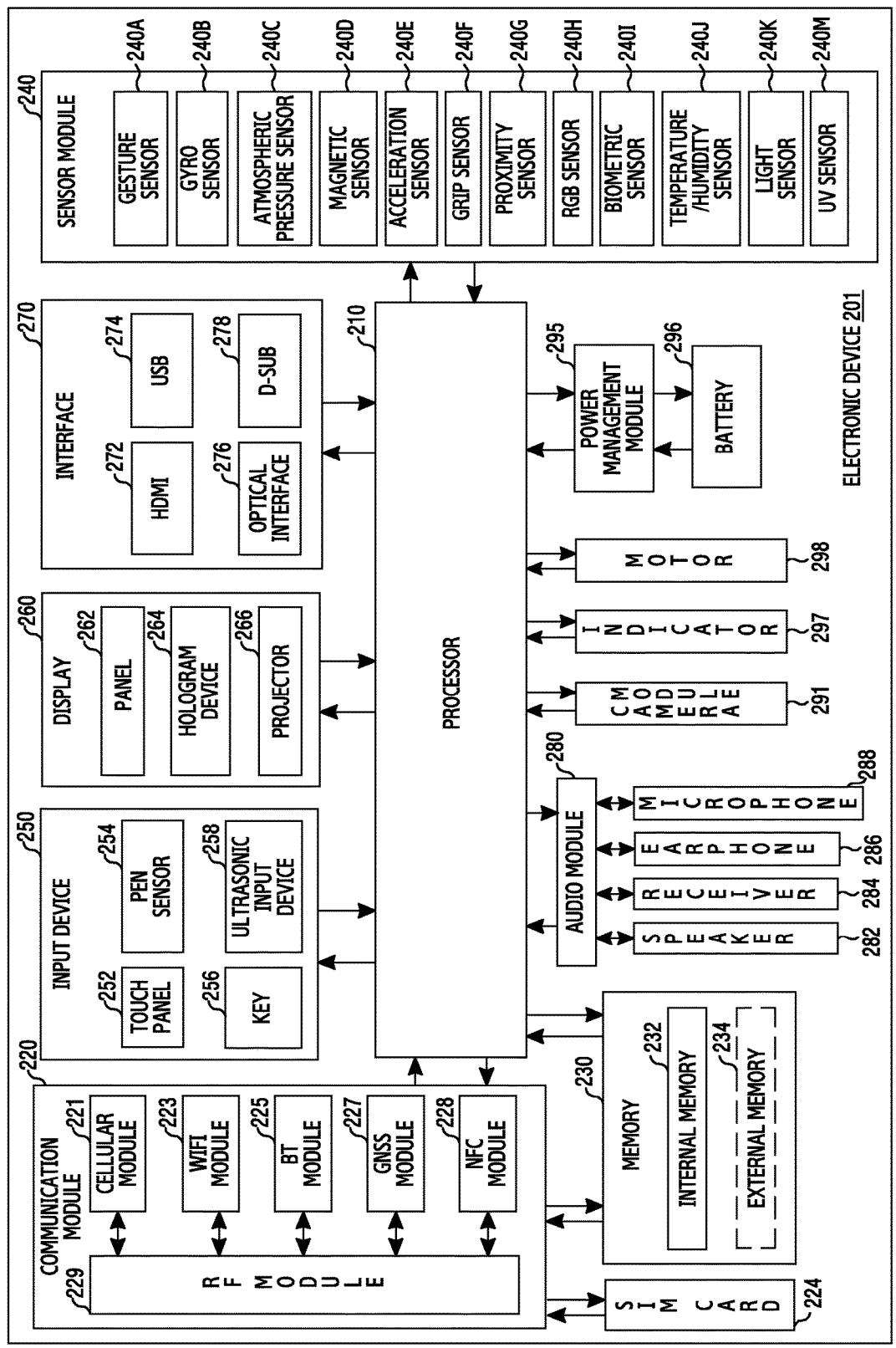
FIG. 2 is a block diagram illustrating an example configuration of an electronic device according to various example embodiments of the present disclosure.

FIG. 2 is a block diagram illustrating an example electronic device according to various example embodiments of the present disclosure.

FIG. 2 is a block diagram of an electronic device 201 according to various example embodiments. For example, the electronic apparatus 201 may include the whole or part of the electronic apparatus 101 illustrated in FIG. 1. The electronic device 201 may include at least one processor (e.g., Application Processor (AP)) (e.g., including processing circuitry) 210, a communication module (e.g., including communication circuitry) 220, a Subscriber Identification Module (SIM) 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software components connected to the processor 210 by driving an operating system or an application program and perform processing of various pieces of data and calculations. The processor 210 may be implemented by, for example, a System on Chip (SoC). According to an embodiment, the processor 210 may further include a Graphic Processing Unit (GPU) and/or an image signal processor. The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory.

The communication module 220 may have a configuration equal or similar to that of the communication interface 170 of FIG. 1. The communication module 220 may include various communication circuitry, such as, for example, and without limitation, the cellular module 221, a Wi-Fi module 223, a Bluetooth (BT) module 225, a GNSS module 227 (e.g., a GPS module, a Glonass module, a Beidou module, or a Galileo module), an NFC module 228, and a Radio Frequency (RF) module 229.

The cellular module 221 may provide a voice call, image call, a text message service, or an Internet service through, for example, a communication network. According to an embodiment, the cellular module 221 may distinguish between and authenticate electronic devices 201 within a communication network using a subscriber identification module (for example, the SIM card 224). According to an embodiment of the present disclosure, the cellular module 221 may perform at least some of the functions that the processor 210 may provide. According to an embodiment, the cellular module 221 may include a Communication Processor (CP).

Each of the Wi-Fi module 223, the BT module 225, the GNSS module 227, and the NFC module 228 may include, for example, a processor for processing data transmitted and received through the relevant module. According to some embodiments of the present disclosure, at least some (e.g., two or more) of the cellular module 221, the Wi-Fi module 223, the BT module 225, the GNSS module 227, and the NFC module 228 may be included in one Integrated Chip (IC) or IC package.

The RF module 229 may transmit/receive, for example, a communication signal (for example, an RF signal). The RF module 229 may include, for example, a transceiver, a Power Amplifier Module (PAM), a frequency filter, a Low Noise Amplifier (LNA), and an antenna. According to another embodiment of the present disclosure, at least one of the cellular module 221, the Wi-Fi module 223, the BT module 225, the GNSS module 227, and the NFC module 228 may transmit and receive RF signals through a separate RF module.

The subscriber identification module 224 may include, for example, a card including a subscriber identity module and/or an embedded SIM, and may contain unique identification information (e.g., an Integrated Circuit Card Identifier (ICCID)) or subscriber information (e.g., an International Mobile Subscriber Identity (IMSI)).

The memory 230 (for example, the memory 130) may include, for example, an internal memory 232 and/or an external memory 234. The embedded memory 232 may include at least one of a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (for example, a NAND flash memory or a NOR flash memory), a hard disc drive, a Solid State Drive (SSD), and the like).

The external memory 234 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 234 may be functionally and/or physically connected to the electronic apparatus 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G a color sensor 240H (for example, a Red/Green/Blue (RGB) sensor), a biometric sensor 240I, a temperature/humidity sensor 240J, a light sensor 240K, and an Ultra Violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic apparatus 201 may further include a processor configured to control the sensor module 240 as a part of or separately from the processor 210, and may control the sensor module 240 while the processor 210 is in a sleep state.

The input device 250 may include various input circuitry, such as, for example, and without limitation, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram device 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram 264 may show a three dimensional image in the air by using an interference of light. The projector 266 may display an image by projecting light onto a screen. The screen may be located, for example, inside or outside the electronic apparatus 201. According to an embodiment, the display 260 may further include a control circuit for controlling the panel 262, the hologram device 264, or the projector 266.

The interface 270 may include various interface circuitry, such as, for example, and without limitation, a High-Definition Multimedia Interface (HDMI) 272, a Universal Serial Bus (USB) 274, an optical interface 276, or a D-subminiature (D-sub) 278. The interface 270 may be included in, for example, the communication interface 170 illustrated in FIG. 1. Additionally or alternatively, the interface 270 may include, for example, a Mobile High-definition Link (MHL) interface, a Secure Digital (SD) card/Multi-Media Card (MMC) interface, or an Infrared Data Association (IrDA) standard interface.

The audio module 280 may bilaterally convert, for example, a sound and an electrical signal. At least some elements of the audio module 280 may be included in, for example, the input/output interface 145 illustrated in FIG. 1. The audio module 280 may process sound information which is input or output through, for example, a speaker 282, a receiver 284, earphones 286, the microphone 288 or the like.

The camera module 291 is a device which may photograph a still image and a dynamic image. According to an embodiment, the camera module 291 may include one or more image sensors (for example, a front sensor or a back sensor), a lens, an Image Signal Processor (ISP) or a flash (for example, LED or xenon lamp).

The power management module 295 may manage, for example, power of the electronic device 201. According to an embodiment, the power management module 295 may include a Power Management Integrated Circuit (PMIC), a charger Integrated Circuit (IC), or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

The indicator 297 may display a particular state (e.g., a booting state, a message state, a charging state, or the like) of the electronic apparatus 201 or a part (e.g., the processor 210). The motor 298 may convert an electrical signal into mechanical vibration, and may generate vibration, a haptic effect, or the like. Although not illustrated, the electronic apparatus 201 may include a processing unit (e.g., a GPU) for supporting a mobile television (TV). The processing unit for supporting mobile TV may, for example, process media data according to a certain standard such as Digital Multimedia Broadcasting (DMB), Digital Video Broadcasting (DVB), or mediaFLO™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
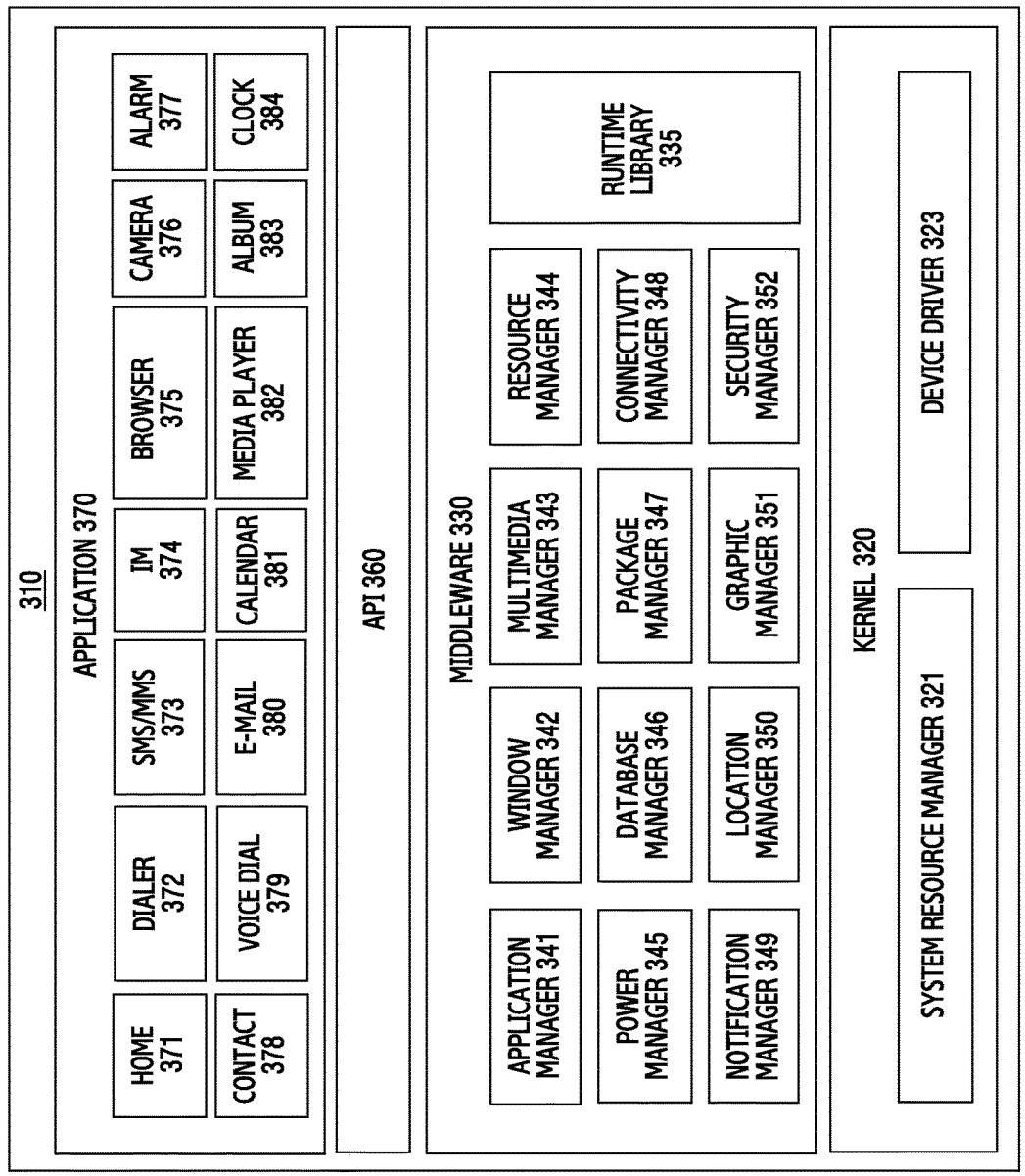
FIG. 3 is a block diagram illustrating an example configuration of a programming module according to various example embodiments of the present disclosure.

FIG. 3 is a block diagram illustrating an example program module according to various example embodiments of the present disclosure.

According to an embodiment, the program module 310 (for example, the program 140) may include an Operating System (OS) for controlling resources related to the electronic device (for example, the electronic device 101) and/or various applications (for example, the application programs 147) executed in the operating system. The operating system may be, for example, Android, iOS, Windows, Symbian, Tizen, Bada, or the like.

The program module 310 may include a kernel 320, middleware 330, an API 360, and/or an application 370. At least some of the program module 310 may be preloaded on the electronic apparatus, or may be downloaded from an external electronic apparatus (e.g., the electronic apparatus 102 or 104, or the server 106).

The kernel 320 (e.g., the kernel 141) may include, for example, a system resource manager 321 and/or a device driver 323. The system resource manager 321 may perform the control, allocation, retrieval, or the like of system resources. According to an embodiment of the present disclosure, the system resource manager 321 may include a process manager, a memory manager, a file system manager, or the like. The device driver 323 may include, for example, a display driver, a camera driver, a Bluetooth driver, a shared memory driver, a USB driver, a keypad driver, a Wi-Fi driver, an audio driver, or an Inter-Process Communication (IPC) driver.

The middleware 330 may provide a function required by the applications 370 in common or provide various functions to the applications 370 through the API 360 so that the applications 370 can efficiently use limited system resources within the electronic device. According to an example embodiment, the middleware 330 (for example, the middleware 143) may include, for example, at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while the applications 370 are being executed. The runtime library 335 may perform input/output management, memory management, the functionality for an arithmetic function, or the like.

The application manager 341 may manage, for example, the life cycle of at least one of the applications 370. The window manager 342 may manage Graphical User Interface (GUI) resources used for the screen. The multimedia manager 343 may determine a format required to reproduce various media files, and may encode or decode a media file by using a coder/decoder (codec) appropriate for the relevant format. The resource manager 344 may manage resources, such as a source code, a memory, a storage space, and the like of at least one of the applications 370.

The power manager 345 may operate together with a Basic Input/Output System (BIOS) to manage a battery or power and may provide power information required for the operation of the electronic device. The database manager 346 may generate, search for, and/or change a database to be used by at least one of the applications 370. The package manager 347 may manage the installation or update of an application distributed in the form of a package file.

The connectivity manager 348 may manage a wireless connection such as, for example, Wi-Fi or Bluetooth. The notification manager 349 may display or notify of an event, such as an arrival message, an appointment, a proximity notification, and the like, in such a manner as not to disturb the user. The location manager 350 may manage location information of the electronic apparatus. The graphic manager 351 may manage a graphic effect, which is to be provided to the user, or a user interface related to the graphic effect. The security manager 352 may provide various security functions required for system security, user authentication, and the like. According to an embodiment of the present disclosure, when the electronic apparatus (e.g., the electronic apparatus 101) has a telephone call function, the middleware 330 may further include a telephony manager for managing a voice call function or a video call function of the electronic apparatus.

The middleware 330 may include a middleware module that forms a combination of various functions of the above-described elements. The middleware 330 may provide a module specialized for each type of OS in order to provide a differentiated function. Also, the middleware 330 may dynamically delete some of the existing elements, or may add new elements.

The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 (for example, the application program 147) may include, for example, one or more applications which can provide functions such as home 371, dialer 372, SMS/MMS 373, Instant Message (IM) 374, browser 375, camera 376, alarm 377, contacts 378, voice dialer 379, email 380, calendar 381, media player 382, album 383, clock 384, health care (for example, measure exercise quantity or blood sugar), or environment information (for example, atmospheric pressure, humidity, or temperature information).

According to an embodiment of the present disclosure, the applications 370 may include an application (hereinafter, referred to as an "information exchange application" for convenience of description) supporting information exchange between the electronic apparatus (e.g., the electronic apparatus 101) and an external electronic apparatus (e.g., the electronic apparatus 102 or 104). The application associated with information exchange may include, for example, a notification relay application for forwarding specific information to an external electronic device, or a device management application for managing an external electronic device.

For example, the notification relay application may include a function of delivering, to the external electronic apparatus (e.g., the electronic apparatus 102 or 104), notification information generated by other applications (e.g., an SMS/MMS application, an email application, a health care application, an environmental information application, etc.) of the electronic apparatus 101. Further, the notification relay application may receive notification information from, for example, an external electronic device and provide the received notification information to a user.

The device management application may manage (for example, install, delete, or update), for example, a function for at least a part of the external electronic device (for example, the electronic device 102 or 104) communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service).

According to an embodiment, the applications 370 may include applications (for example, a health care application of a mobile medical appliance or the like) designated according to attributes of the external electronic device 102 or 104. According to an embodiment of the present disclosure, the application 370 may include an application received from the external electronic apparatus (e.g., the server 106, or the electronic apparatus 102 or 104). According to an embodiment of the present disclosure, the application 370 may include a preloaded application or a third party application which can be downloaded from the server. Names of the elements of the program module 310, according to the above-described embodiments of the present disclosure, may change depending on the type of OS.

According to various embodiments of the present disclosure, at least some of the program module 310 may be implemented in software, firmware, hardware, or a combination of two or more thereof. At least some of the program module 310 may be implemented (e.g., executed) by, for example, the processor (e.g., the processor 210). At least some of the program module 310 may include, for example, a module, a program, a routine, a set of instructions, and/or a process for performing one or more functions.

The term "module" as used herein may, for example, refer to a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module' may be a minimum unit for performing one or more functions or a part thereof. The "module" may be mechanically or electronically implemented. For example, the "module" according to the present disclosure may include at least one of a dedicated processor, a CPU, an Application-Specific Integrated Circuit (ASIC) chip, a Field-Programmable Gate Arrays (FPGA), and a programmable-logic device for performing operations which has been known or are to be developed hereinafter.

According to various example embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

Figure 4A:
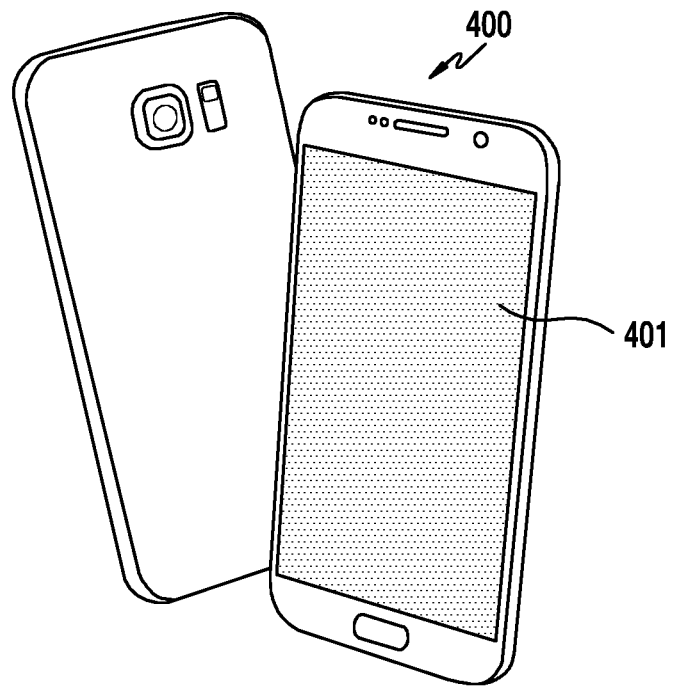
FIGS. 4A and 4B are diagrams illustrating example electronic devices including a display apparatus according to various example embodiments of the present disclosure.
Figure 4B:
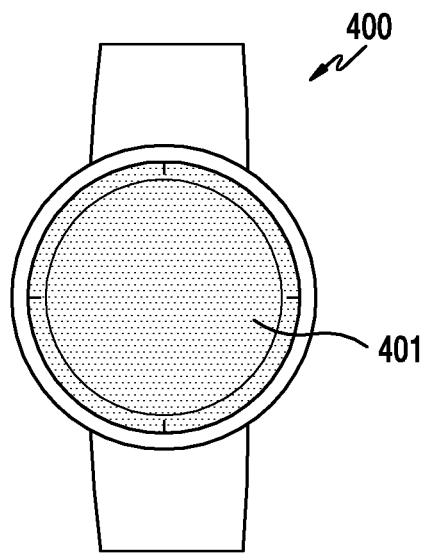

FIGS. 4A and 4B are diagrams illustrating example electronic devices including a display apparatus according to various example embodiments of the present disclosure.

According to various example embodiments of the present disclosure, the electronic device 400 may have the configuration corresponding to the electronic device (indicated by reference numeral 201 of FIG. 2) described above with reference to FIG. 2. According to various embodiments of the present disclosure, the display apparatus 401 may have the configuration corresponding to the display (indicated by reference numeral 260 of FIG. 2) described above with reference to FIG. 2.

As illustrated in FIG. 4A, the display apparatus 401 according to various embodiments of the present disclosure may be applied to the various electronic devices 400. For example, according to various embodiments of the present disclosure, the electronic device 400 may include at least one of a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a Moving Picture Experts Group (MPEG)-1 Audio Layer 3 (MP3) player, a mobile medical device, a camera, and a wearable device, or the like, but is not limited thereto.

As illustrated in FIG. 4B, the display apparatus 401 according to various example embodiments of the present disclosure may be applied to the various electronic devices 400. The electronic device 400 may be, for example, a wearable device. According to various embodiments of the present disclosure, the wearable device may include, without limitation, at least one of an accessory type (e.g., a watch, a ring, a bracelet, an anklet, a necklace, glasses, contact lens, or a Head-Mounted Device (HMD)), a fabric- or clothing-integrated type (e.g., an electronic clothing), a body-attachable type (e.g., a skin pad or tattoo), and a bio-implantable type (e.g., an implantable circuit).

According to various example embodiments of the present disclosure, the display apparatus 401 may include various colors. When an operation of the display apparatus 401 is in an on-state or off-state, the display apparatus 401 may display a color. For example, the display apparatus 401 may have a color even when the display apparatus 401 is in a state of not being driven, and accordingly, can ensure a superior outward appearance design. Alternatively, the display apparatus 401 may display a color even when an operation of the display apparatus 401 is in an off-state, and accordingly, can improve an aesthetic impression. According to various embodiments of the present disclosure, the display apparatus 401 may represent a color, such as, without limitation, white, gold, silver, deep blue, wine, purple, or the like.

Figure 5A:
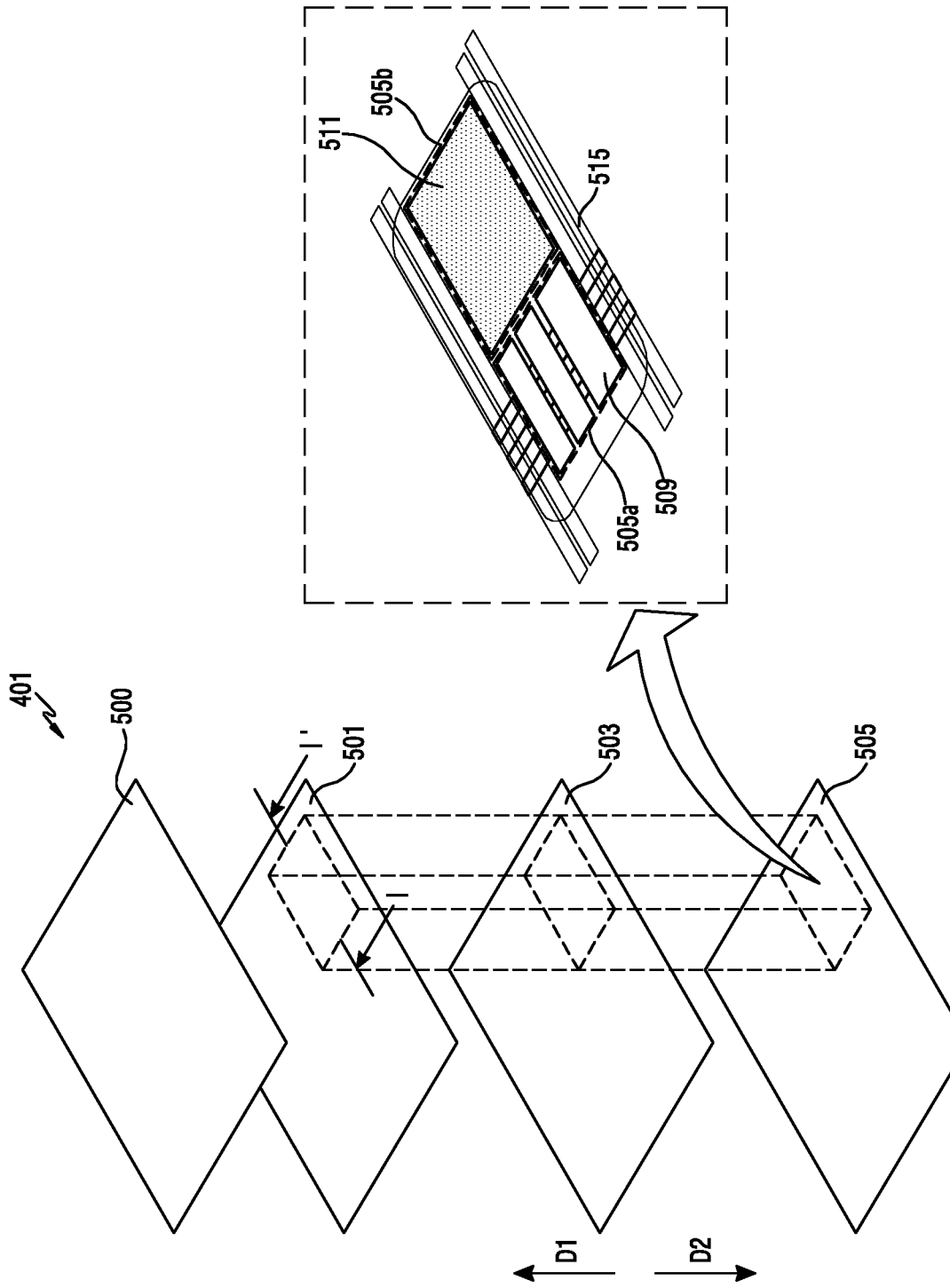
FIG. 5A is an exploded perspective view of illustrating an example display apparatus according to various example embodiments of the present disclosure.

FIG. 5A is an exploded perspective view illustrating an example display apparatus according to various example embodiments of the present disclosure. FIGS. 5B, 5C, 5D, 5E and 5F each illustrate a cross-sectional view taken along line I-I' of FIG. 5A.

As illustrated in FIG. 5A, the display apparatus 401 according to various embodiments of the present disclosure may include, for example, a window layer 500, a polarizing layer 501, a phase difference layer 503, a color layer 511, and a pixel layer 505.

The window layer 500 may form one outward appearance of the display apparatus 401. The window layer 500 can protect an internal configuration of the display apparatus 401. The window layer 500 may transmit internal light, which is generated within the display apparatus 401, to the outside. Also, the window layer 500 may transmit external light, which arrives at the outside of the display apparatus 401, to the inside of the display apparatus 401. The window layer 500 may comprise a material having excellent light transmittance, thermal endurance, chemical resistance, mechanical strength, and the like. Here, the window layer 500 may be, for example, and without limitation, a transparent film substrate or a glass substrate formed of polyethylene terephthalate and the like, or may be, for example, without limitation, a plastic substrate formed of polymethylmethacrylate, polyamide, polyimide, polypropylene, polyurethane, or the like.

According to various example embodiments of the present disclosure, the window layer 500 may further include a touch screen (not illustrated) capable of sensing a touch input or various inputs which are performed on the surface thereof. The touch screen may correspond to the touch panel 252 described with reference to FIG. 2. The touch screen may sense a touch by using at least one of, for example, a capacitive type, a resistive type, an infrared type, and a surface acoustic wave type, but is not limited thereto.

Although not illustrated in the drawings, the touch screen may be disposed at various locations within the electronic device 400. The touch screen may be disposed on the window layer 500. Alternatively, the touch screen may be disposed on the pixel layer 505. Alternatively, the touch screen may be integrally formed with the pixel layer 505.

According to various example embodiments of the present disclosure, the touch screen may further include a tactile layer and may provide a tactile reaction to a user. According to various embodiments of the present disclosure, the touch screen may include a pressure sensor (or a force sensor, the terms will be interchangeably used hereinafter) capable of measuring a pressure strength of a touch made by the user. The pressure sensor may be integrally implemented with the touch screen, or may be implemented as one or more sensors separately from the touch screen. The pressure sensor may be implemented in various shapes, sizes, and numbers thereof within the electronic device 400.

The polarizing layer 501 may allow light, which is incident while vibrating in various directions, to become light (e.g., polarized light) which vibrates in only one direction. The polarizing layer 501 may be disposed in a first direction D1 of the pixel layer 505. Meanwhile, although not illustrated in the drawings, the polarizing layer 501 may be disposed in a second direction D2 of the pixel layer 505. For example, the polarizing layers 501 may be disposed at respective upper and lower parts of the pixel layer 505. The polarizing layer 501 may be, for example, and without limitation, an iodine-based type polarizing layer or a dye-based type polarizing layer.

The phase difference layer 503 (e.g., retardation film) may delay the phase of incident light. The phase difference layer 503 may delay light by, for example, ¼ of the wavelength of the light. The phase difference layer 503 may transform linearly polarized light, which passes through the polarizing layer 501, into circularly polarized light. The polarizing layer 501 may be disposed in the first direction D1 of the pixel layer 505.

Figure 5B:
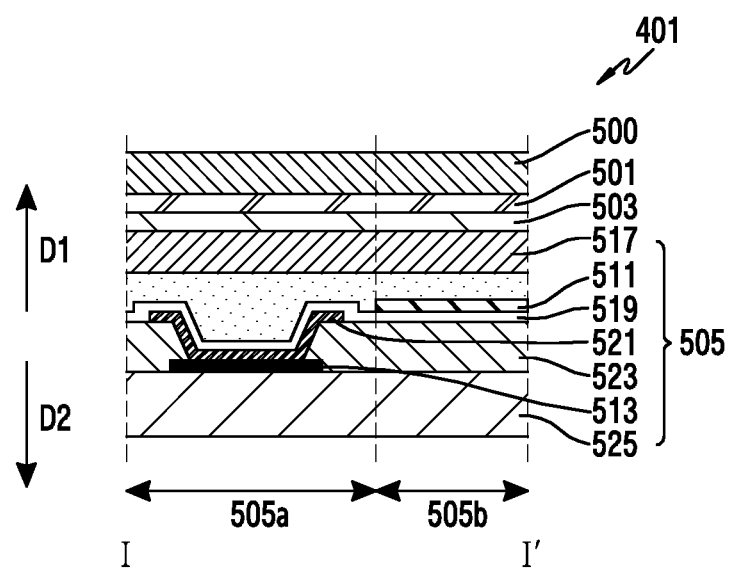
FIGS. 5B, 5C, 5D, 5E and 5F are cross-sectional views taken along line I-I' of FIG. 5A.

As illustrated in FIGS. 5A and 5B, the pixel layer 505 may include a first area 505a and a second area 505b. Pixels 509 may be disposed in the first area 505a. The pixels 509 may display graphic information received through the processor 120. The pixel 509 may include light-emitting elements 521 that emit light of different colors. The term light-emitting element as used herein will be understood to include, for example, and without limitation, any type of light-emitter, such as, for example, and without limitation an organic light-emitting diode (OLED), liquid crystal display (LCD) pixel, that may include, for example, a backlight arrangement, or the like. The terms light-emitting element and light-emitter may be used interchangeably. For example, the light-emitting elements 521 may emit light of different colors, such as a first color, a second color, and a third color. The first color, second color, and third color may be, for example, Red (R), Green (G), and Blue (B), respectively. However, various example embodiments of the present disclosure are not limited thereto, and a combination of the first, second, and third colors is not limited if the combination thereof enables the implementation of white light.

The color layer 511 may be disposed in the second area 505b. The color layer 511 may include a material capable of representing a particular color. When an operation of the display apparatus 401 is in an on-state or off-state, the color layer 511 may represent a color. When at least one pixel 509 does not operate, the color layer 511 may allow a designated color to be capable of being exposed to the outside through the window layer 500. For example, the color layer 511 may have a color regardless of the driving of the display apparatus 401, so that it is possible to ensure a superior outward appearance design. According to various embodiments of the present disclosure, the color layer 511 may have a color, such as, for example, and without limitation, white, gold, silver, deep blue, wine, purple, or the like.

Alternatively, the color layer 511 may include a structure which causes diffused reflection. For example, the color layer 511 may include anti-glare film or anti-glare glass. According to various example embodiments of the present disclosure, the display apparatus 401 may display a twinkling effect through the color layer 511.

The second area 505b may be disposed adjacent to the first area 505a. For example, the first area 505a and the second area 505b may be alternately disposed in the pixel layer 505. Alternatively, the first area 505a and the second area 505b may be disposed in the form of a matrix. Alternatively, the first area 505a and the second area 505b may be disposed in the form of a lattice. Alternatively, the first area 505a and the second area 505b may be disposed in the form of a checkerboard. Alternatively, the first area 505a and the second area 505b may be disposed to intersect with each other.

Meanwhile, the pixel layer 505 may further include various driving wirings 515, such as gate lines, data lines, or the like. A gate line may deliver a selection signal to a pixel electrode 513. A data line may deliver a data signal to the pixel electrode 513. The driving wirings 515 may drive the light-emitting elements 521 and may allow an image to be displayed.

As illustrated in FIGS. 5A and 5B, the pixel layer 505 may include a first substrate 525, a pixel electrode 513, a light-emitting element 521, a pixel separation layer 523, a cathode 519, a color layer 511, a second substrate 517, and the like.

The first substrate 525 may include a first plane, which faces a first direction D1, and a second plane which faces a second direction D2. The first substrate 525 may include, for example, and without limitation, glass or plastic film.

According to various example embodiments of the present disclosure, the first substrate 525 may have a color according to the color layer 511. For example, the first substrate 525 may have a color formed thereon in response to the color of the color layer 511. The first substrate 525 may have a color which is identical or similar to that of the color layer 511. For example, when the color layer 511 is in a gold color, at least part of the first substrate 525 may have a color, such as a gold color, a copper color, or the like. Partial colors of the display apparatus 401 may coincide with each other as a whole by causing a color reflected by the first substrate 525 to be similar to a color represented through the color layer 511.

The first substrate 525 may have various elements, such as the pixel electrode 513, the pixel separation layer 523, the light-emitting element 521, the cathode 519, and the like, that are formed thereon. The first substrate 525 may support various elements formed thereon.

The pixel electrode 513 may apply a signal voltage to the light-emitting element 521. The pixel electrode 513 may include, for example, and without limitation, lithium (Li), calcium (Ca), lithium fluoride/calcium (LiF/Ca), lithium fluoride/aluminum (LiF/Al), aluminum (Al), silver (Ag), magnesium (Mg), gold (Au), or the like. Alternatively, the pixel electrode 513 may include a transparent conductive material, such as indium tin oxide (ITO), indium zinc oxide (IZO), zinc oxide (ZnO), indium oxide ($In_2O_3$), or the like.

The light-emitting element 521 may have a multi-layered structure including a hole injection layer, a hole transport layer, a light-emitting layer, an electron transport layer, and an electron injection layer, starting from the top of the pixel electrode 513. The light-emitting element 521 may be a transparent electrode or a translucent electrode. The light-emitting element 521 may include one or more materials selected from silver (Ag), aluminum (Al), magnesium (Mg), lithium (Li), calcium (Ca), copper (Cu), LiF/Ca, LiF/Al, magnesium silver (MgAg), and calcium silver (CaAg), and may be formed as a thin film having a thickness of several nanometers to several tens of nanometers.

The pixel separation layer 523 may be disposed between the light-emitting elements 521 so as to be spaced from each other, and may allow RGB colors to be clearly represented without being mixed with each other. The pixel separation layer 523 may, for example be a Black Matrix (BM) area.

The cathode 519 may be disposed on the light-emitting element 521. The cathode 519 may include, for example, an opaque conductive material, for example, various metals.

The second substrate 517 can protect various elements disposed on the first substrate 525. The second substrate 517 may be an encapsulation layer. Alternatively, the second substrate 517 may include glass. Alternatively, the second substrate 517 may be an organic/inorganic multilayer or a metallic protection layer.

Meanwhile, although not illustrated in the drawings, the second substrate 517 may have various layers, such as an adhesive layer, a hard coating layer, and the like, that are further disposed thereon.

According to various embodiments of the present disclosure, as illustrated in FIG. 5B, the first substrate 525 may have the color layer 511 disposed thereon. The color layer 511 may be disposed in a first direction D1 of the first substrate 525 in the second area 505b. The first substrate 525 may have the color layer 511 disposed on the same plane on which the pixel electrode 513, the light-emitting element 521, the pixel separation layer 523, the cathode 519, or the like is disposed. The first substrate 525 may have the color layer 511 disposed in the same direction in which the pixel electrode 513, the light-emitting element 521, the pixel separation layer 523, the cathode 519, or the like is disposed.

Figure 5C:
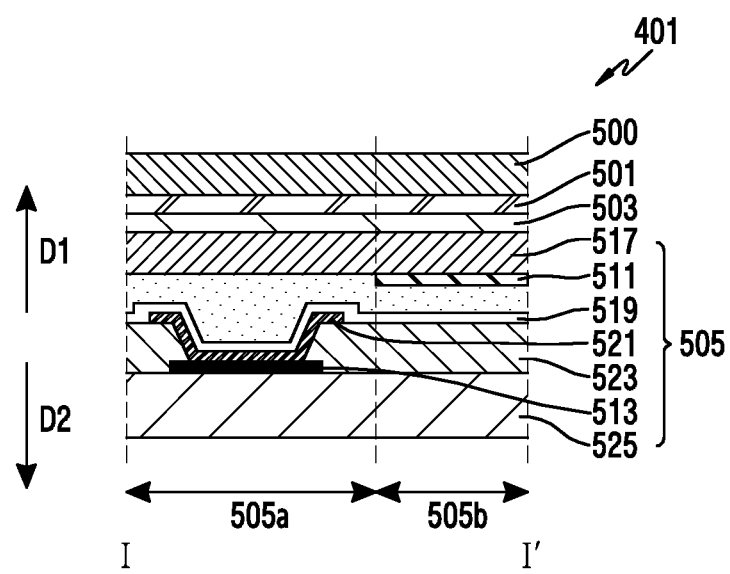

According to various example embodiments of the present disclosure, as illustrated in FIG. 5C, the second substrate 517 may have the color layer 511 disposed thereon. The color layer 511 may be disposed in a second direction D2 of the second substrate 517 in the second area 505b. The color layer 511 may be disposed to face the first substrate 525.

Figure 5D:
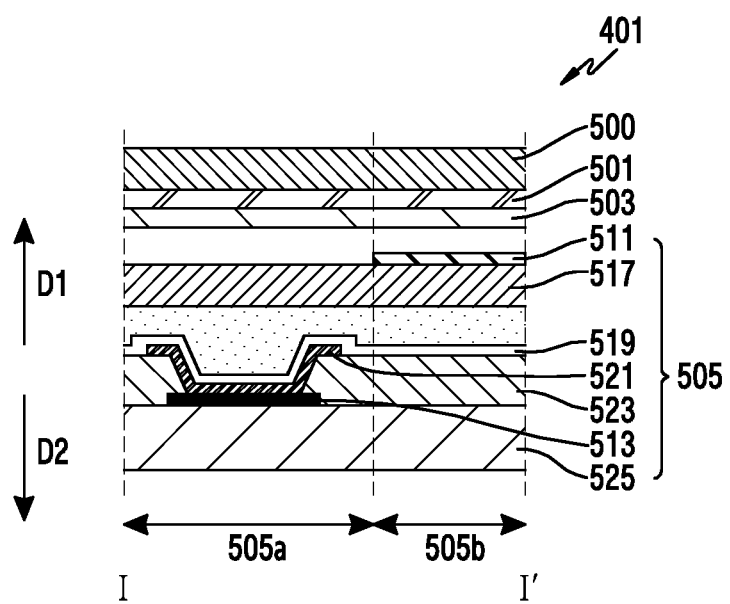

According to various example embodiments of the present disclosure, as illustrated in FIG. 5D, the second substrate 517 may have the color layer 511 disposed thereon. The color layer 511 may be disposed in a first direction D1 of the second substrate 517 in the second area 505b.

Figure 5E:
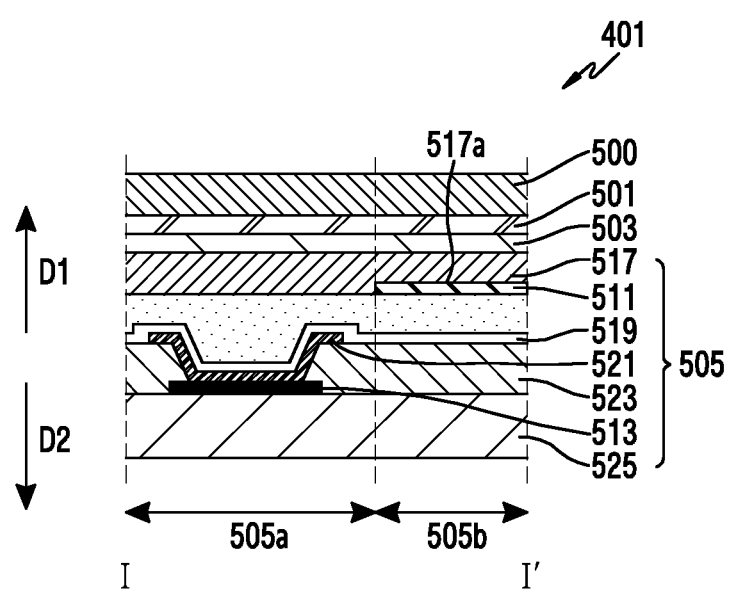

According to various example embodiments of the present disclosure, as illustrated in FIG. 5E, the second substrate 517 may include a recess 517a. For example, the recess 517a may be a part that is concavely formed in the first direction D1 on the second substrate 517. The recess 517a may be a groove formed on the second substrate 517. The color layer 511 may be disposed in the recess 517a. Meanwhile, although not illustrated in the drawings, the recess 517a may be formed in the second direction D2 on the second substrate 517, and the color layer 511 may be disposed in the recess 517a.

Meanwhile, the color layer 511 may be formed by dyeing a part of the second substrate 517 or by changing the color of the part thereof. For example, instead of separately forming the color layer 511 in the recess 517a, the color layer 511 may be formed by dyeing a part at which the color layer 511 is desired to be formed on the second substrate 517, or by changing the color of the part.

Figure 5F:
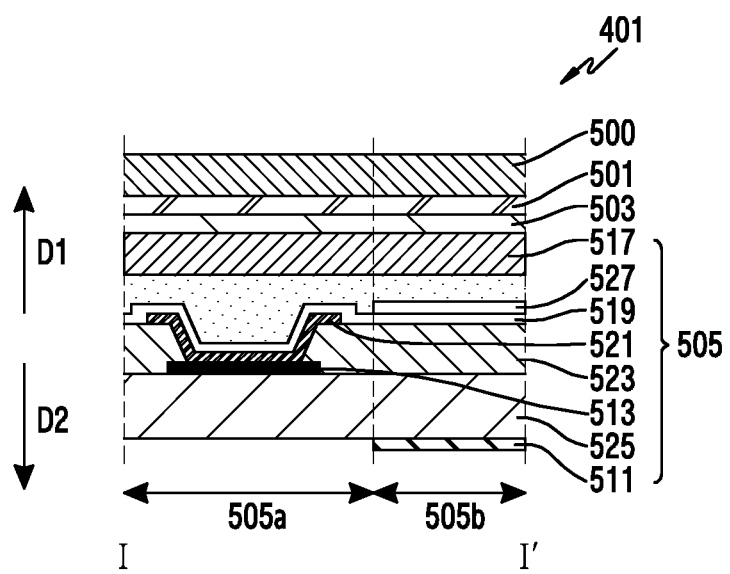

According to various example embodiments of the present disclosure, as illustrated in FIG. 5F, the first substrate 525 may have the color layer 511 disposed thereon. The color layer 511 may be disposed in a second direction D2 of the first substrate 525 in the second area 505b. The first substrate 525 may have the color layer 511 disposed on a plane which is opposite to a plane on which the pixel electrode 513, the light-emitting element 521, the pixel separation layer 523, the cathode 519, or the like is disposed. The first substrate 525 may have the color layer 511 disposed in a direction which is opposite to a direction in which the pixel electrode 513, the light-emitting element 521, the pixel separation layer 523, the cathode 519, or the like is disposed.

In the present example, the first substrate 525 may have a transparent layer 527 further disposed thereon. For example, the first substrate 525 may have the transparent layer 527 further disposed on a plane which is opposite to a plane on which the color layer 511 is disposed. The color layer 511 and the transparent layer 527 may be disposed at an upper part and a lower part in the second area 505b. The transparent layer 527 may transmit light reflected by the color layer 511. The transparent layer 527 may be a separate layer formed to be transparent. Alternatively, the transparent layer 527 may be a layer including a material having a high transmittance.

Meanwhile, according to various example embodiments of the present disclosure, when the color layer 511 is disposed in the second direction D2 of the first substrate 525 and the transparent layer 527 is not separately included, the layout of the driving wirings 515 may become different. For example, the driving wirings 515 may be disposed to not overlap the color layer 511. For example, the driving wirings 515 may be disposed to detour around an area in which the color layer 511 is disposed. Alternatively, the driving wirings 515 may be removed in the area where the color layer 511 is disposed.

Meanwhile, although not illustrated in the drawings, the first substrate 525 may include a recess, and the color layer 511 may be disposed in the recess. Alternatively, the color layer 511 may be formed by dyeing a part of the first substrate 525 or by changing the color of the part thereof. The color layer 511 may be formed by dyeing a part at which the color layer 511 is desired to be formed on the first substrate 525, or by changing the color of the part.

Figure 6A:
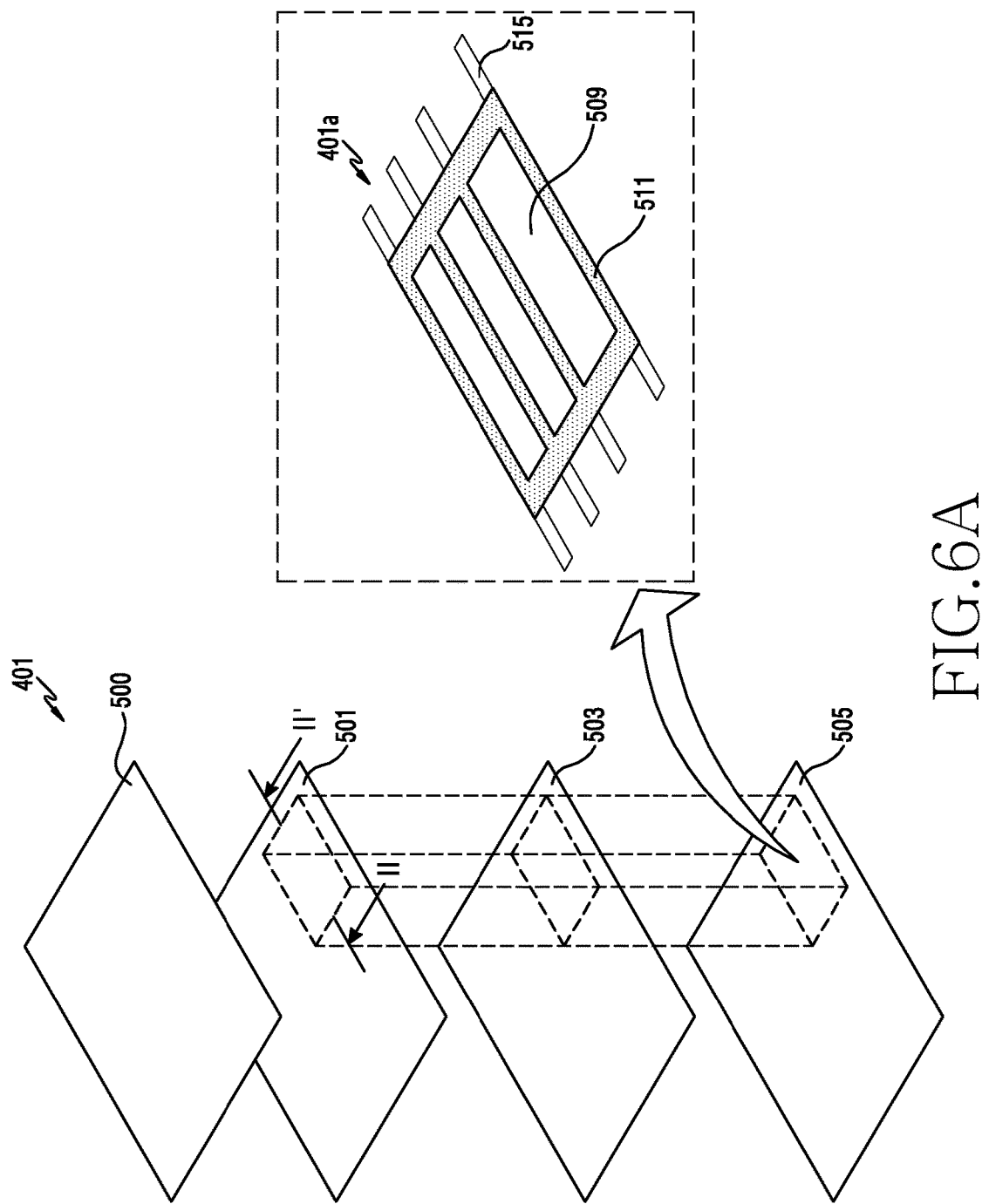
FIG. 6A is an exploded perspective view illustrating an example display apparatus according to various example embodiments of the present disclosure.

FIG. 6A is an exploded perspective view illustrating an example display apparatus according to various example embodiments of the present disclosure. FIGS. 6B, 6C, 6D, 6E, 6F and 6G are cross-sectional views taken along line II-IF of FIG. 6A.

As illustrated in FIG. 6A, according to various example embodiments of the present disclosure, the second area 505b may be disposed in an area corresponding to an area in which the driving wirings 515 are disposed. The second area 505b may be disposed in a BM area.

Figure 6B:
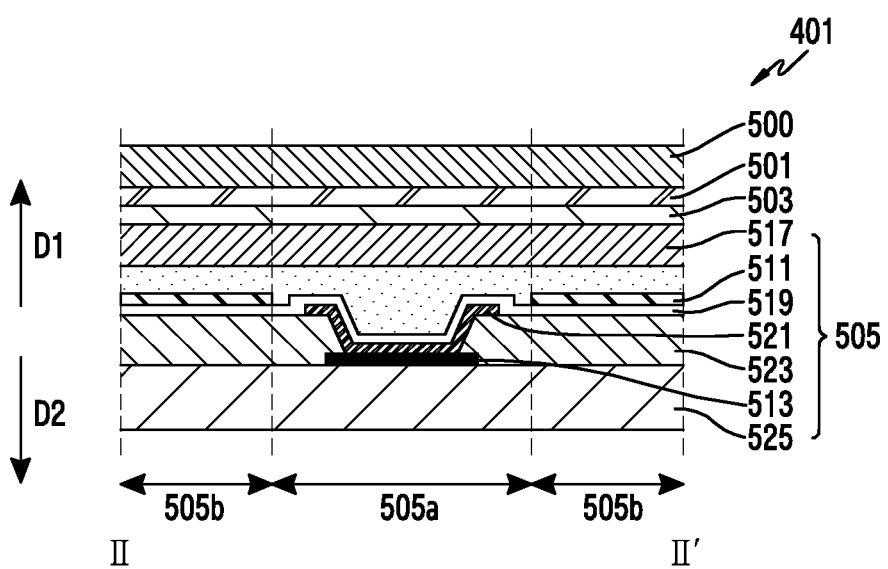
FIGS. 6B, 6C, 6D, 6E, 6F and 6G are cross-sectional view taken along line II-IF of FIG. 6A.

According to various example embodiments of the present disclosure, as illustrated in FIG. 6B, the first substrate 525 may have the color layer 511 disposed thereon. The color layer 511 may be disposed in the first direction D1 of the first substrate 525 in the second area 505b. The first substrate 525 may have the color layer 511 disposed on the same plane on which the pixel electrode 513, the light-emitting element 521, the pixel separation layer 523, the cathode 519, or the like is disposed. The first substrate 525 may have the color layer 511 disposed in the same direction in which the pixel electrode 513, the light-emitting element 521, the pixel separation layer 523, the cathode 519, or the like is disposed.

Figure 6C:
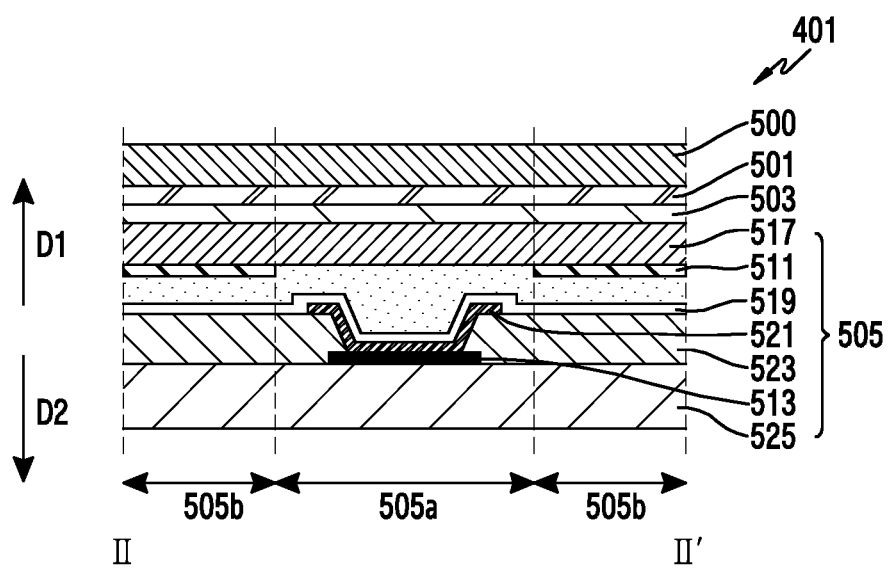

According to various example embodiments of the present disclosure, as illustrated in FIG. 6C, the second substrate 517 may have the color layer 511 disposed thereon. The color layer 511 may be disposed in a second direction D2 of the second substrate 517 in the second area 505b. The color layer 511 may be disposed to face the first substrate 525.

Figure 6D:
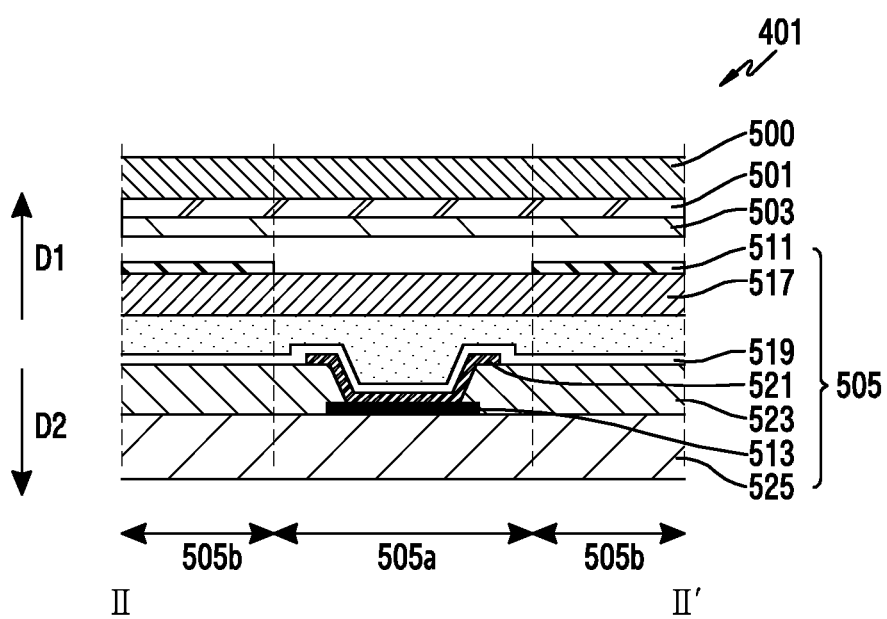

According to various example embodiments of the present disclosure, as illustrated in FIG. 6D, the second substrate 517 may have the color layer 511 disposed thereon. The color layer 511 may be disposed in a first direction D1 of the second substrate 517 in the second area 505b.

Figure 6E:
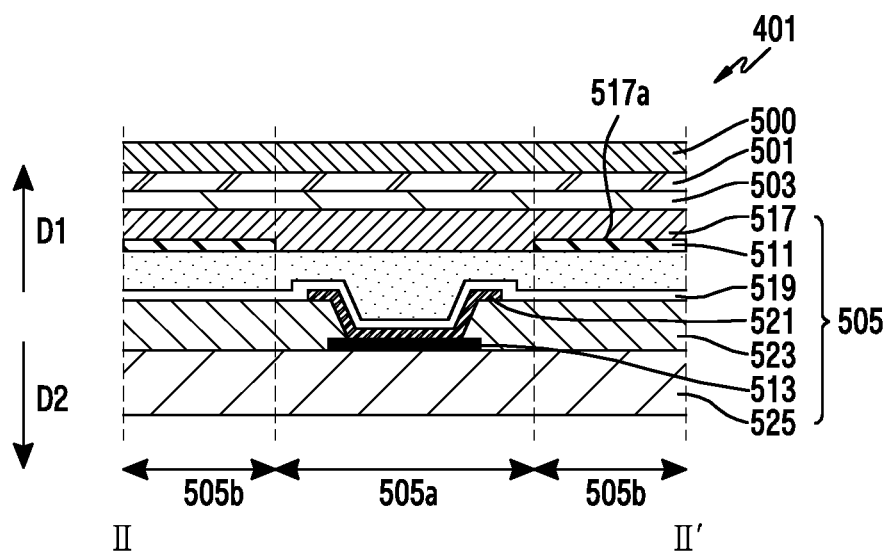

According to various example embodiments of the present disclosure, as illustrated in FIG. 6E, the second substrate 517 may include a recess 517a. For example, the recess 517a may be a part that is concavely formed in the first direction D1 on the second substrate 517. The recess 517a may be a groove formed on the second substrate 517. The color layer 511 may be disposed in the recess 517a. Meanwhile, although not illustrated in the drawings, the recess 517a may be formed in the second direction D2 on the second substrate 517, and the color layer 511 may be disposed in the recess 517a.

Meanwhile, the color layer 511 may be formed by dyeing a part of the second substrate 517 or by changing the color of the part thereof. For example, instead of separately forming the color layer 511 in the recess 517a, the color layer 511 may be formed by dyeing a part at which the color layer 511 is desired to be formed on the second substrate 517, or by changing the color of the part.

Figure 6F:
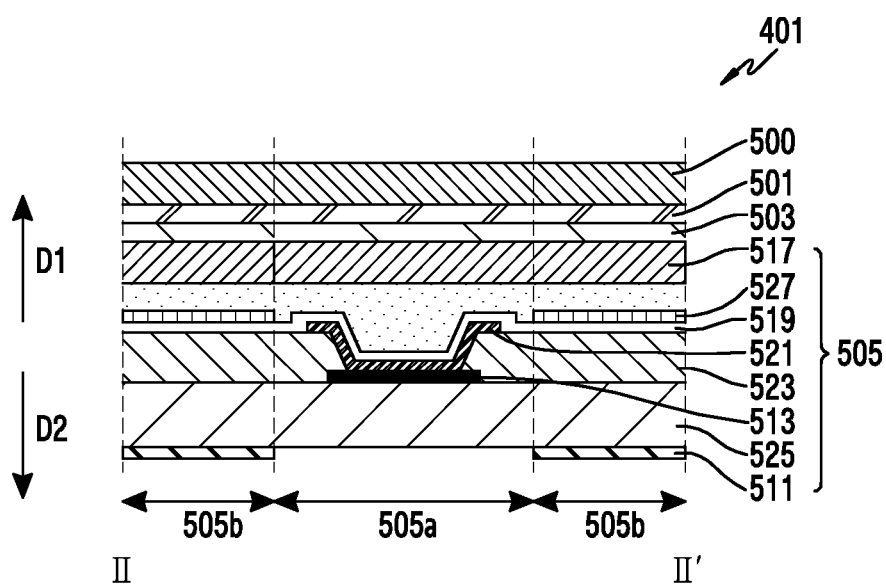

According to various example embodiments of the present disclosure, as illustrated in FIG. 6F, the first substrate 525 may have the color layer 511 disposed thereon. The color layer 511 may be disposed in a second direction D2 of the first substrate 525 in the second area 505b. The first substrate 525 may have the color layer 511 disposed on a plane which is opposite to a plane on which the pixel electrode 513, the light-emitting element 521, the pixel separation layer 523, the cathode 519, or the like is disposed. The first substrate 525 may have the color layer 511 disposed in a direction which is opposite to a direction in which the pixel electrode 513, the light-emitting element 521, the pixel separation layer 523, the cathode 519, or the like is disposed.

In the present example, the first substrate 525 may have a transparent layer 527 further disposed thereon. For example, the first substrate 525 may have the transparent layer 527 further disposed on a plane which is opposite to a plane on which the color layer 511 is disposed. The color layer 511 and the transparent layer 527 may be disposed at an upper part and a lower part in the second area 505b. The transparent layer 527 may transmit light reflected by the color layer 511. The transparent layer 527 may be a separate layer formed to be transparent. Alternatively, the transparent layer 527 may be a layer including a material having a high transmittance.

Meanwhile, according to various embodiments of the present disclosure, when the color layer 511 is disposed in the second direction D2 of the first substrate 525 and the transparent layer 527 is not separately included, the layout of the driving wirings 515 may become different. For example, the driving wirings 515 may be disposed to not overlap the color layer 511. For example, the driving wirings 515 may be disposed to detour around an area in which the color layer 511 is disposed. Alternatively, the driving wirings 515 may be removed in the area where the color layer 511 is disposed.

Meanwhile, although not illustrated in the drawings, the first substrate 525 may include a recess, and the color layer 511 may be disposed in the recess. Alternatively, the color layer 511 may be formed by dyeing a part of the first substrate 525 or by changing the color of the part thereof. The color layer 511 may be formed by dyeing a part at which the color layer 511 is desired to be formed on the first substrate 525, or by changing the color of the part.

Figure 6G:
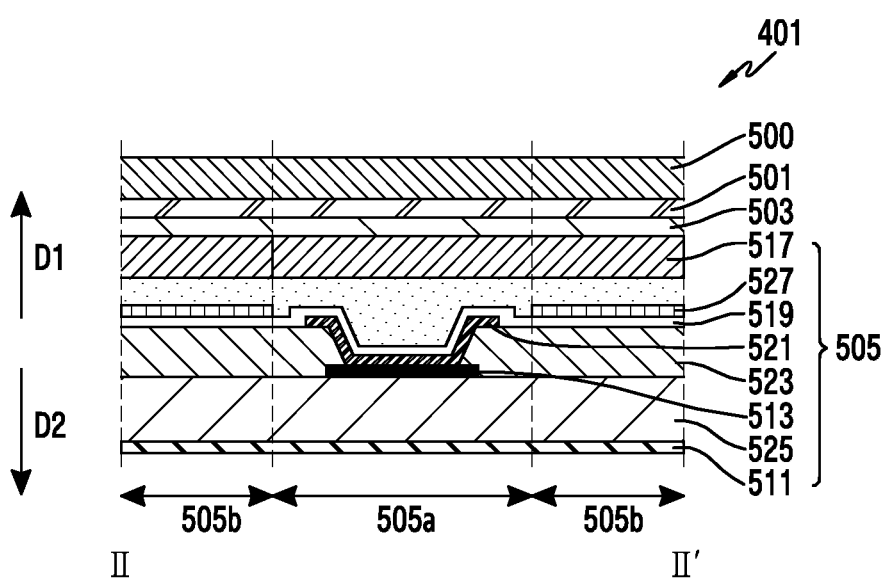

According to various example embodiments of the present disclosure, as illustrated in FIG. 6G the first substrate 525 may have the color layer 511 disposed thereon. The color layer 511 may be disposed in the second direction D2 of the first substrate 525 in the first area 505a and the second area 505b. The first substrate 525 may have the color layer 511 disposed on a plane which is opposite to a plane on which the pixel electrode 513, the light-emitting element 521, the pixel separation layer 523, the cathode 519, or the like is disposed. The first substrate 525 may have the color layer 511 disposed in a direction which is opposite to a direction in which the pixel electrode 513, the light-emitting element 521, the pixel separation layer 523, the cathode 519, or the like is disposed.

FIGS. 7A, 7B, 7C and 7D are cross-sectional views of a display apparatus according to various example embodiments of the present disclosure. FIGS. 7A to 7D each illustrate a cross-sectional view taken along line I-I' of FIG. 5A.

Figure 7A:
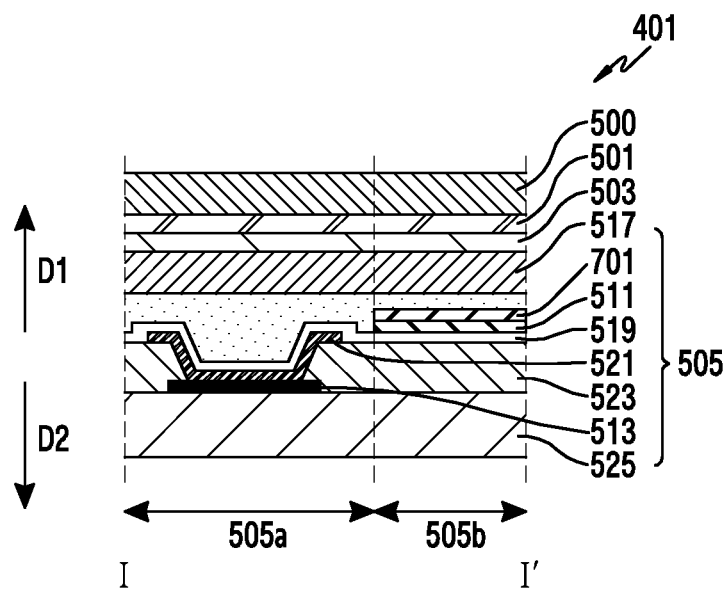
FIGS. 7A, 7B, 7C and 7D are cross-sectional views of an example display apparatus according to various example embodiments of the present disclosure.

As illustrated in FIG. 7A, the display apparatus 401 according to various example embodiments of the present disclosure may further include a pattern-formation layer 701. The pattern-formation layer 701 may represent various impressions for the display apparatus 401. The pattern-formation layer 701 may allow the display apparatus 401 to represent texture. According to various example embodiments of the present disclosure, when an operation of the display apparatus 401 is in an on-state or off-state, the pattern-formation layer 701 may allow the display apparatus 401 to display a color having texture.

For example, the pattern-formation layer 701 may include, without limitation, lenses having various shapes. Alternatively, the pattern-formation layer 701 may include, without limitation, a fine particle material, metal powder, beads, or the like. The pattern-formation layer 701 may be disposed on the color layer 511. The pattern-formation layer 701 may refract light reflected by the color layer 511. Accordingly, light which has passed through the pattern-formation layer 701 may appear foggy or may appear to represent white round spots. For example, the display apparatus 401 may display a particular color, which is represented by the color layer 511, in such a manner that the pattern-formation layer 701 causes the particular color to appear foggy or include a pattern.

As illustrated in FIG. 7A, the color layer 511 and the pattern-formation layer 701 may be disposed in the second area 505b. The color layer 511 and the pattern-formation layer 701 may be disposed in order along the first direction D1 on the first substrate 525.

Figure 7B:
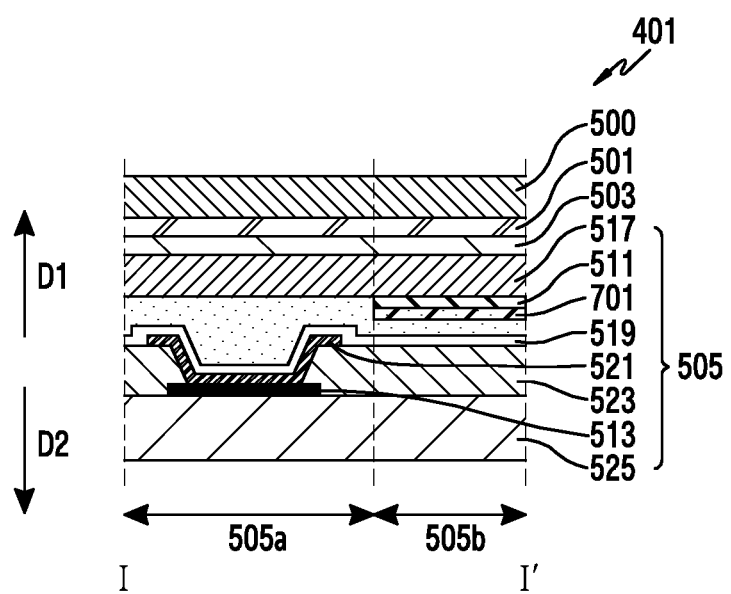

According to various example embodiments of the present disclosure, as illustrated in FIG. 7B, the pattern-formation layer 701 and the color layer 511 may be disposed in the second area 505b. The color layer 511 and the pattern-formation layer 701 may be disposed in order along the second direction D2 on the second substrate 517.

Figure 7C:
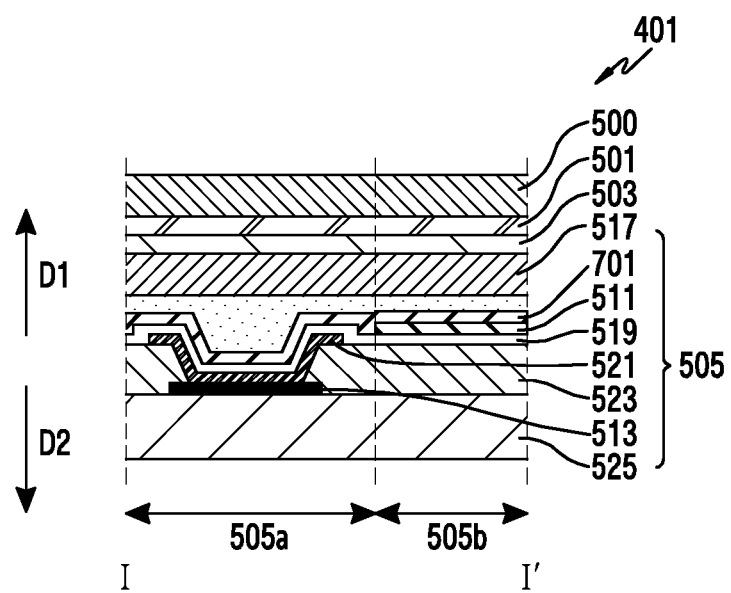

According to various example embodiments of the present disclosure, as illustrated in FIG. 7C, the color layer 511 may be disposed in the second area 505b, and the pattern-formation layer 701 across the first area 505a and the second area 505b. The color layer 511 and the pattern-formation layer 701 may be disposed in order along the first direction D1 on the first substrate 525.

Figure 7D:
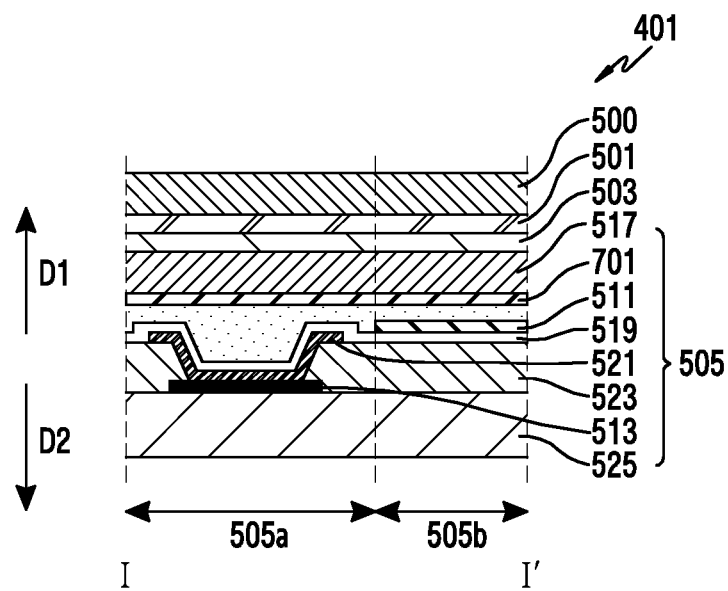

According to various example embodiments of the present disclosure, as illustrated in FIG. 7D, the color layer 511 may be disposed in the second area 505b, and the pattern-formation layer 701 may be disposed across the first and second areas 505a and 505b. The color layer 511 may be disposed on the first substrate 525, and the pattern-formation layer 701 may be disposed in the second substrate 517.

Meanwhile, the various example embodiments of the present disclosure are not limited thereto, and the color layer 511 and the pattern-formation layer 701 may be disposed at various locations within the display apparatus 401.

Figure 8:
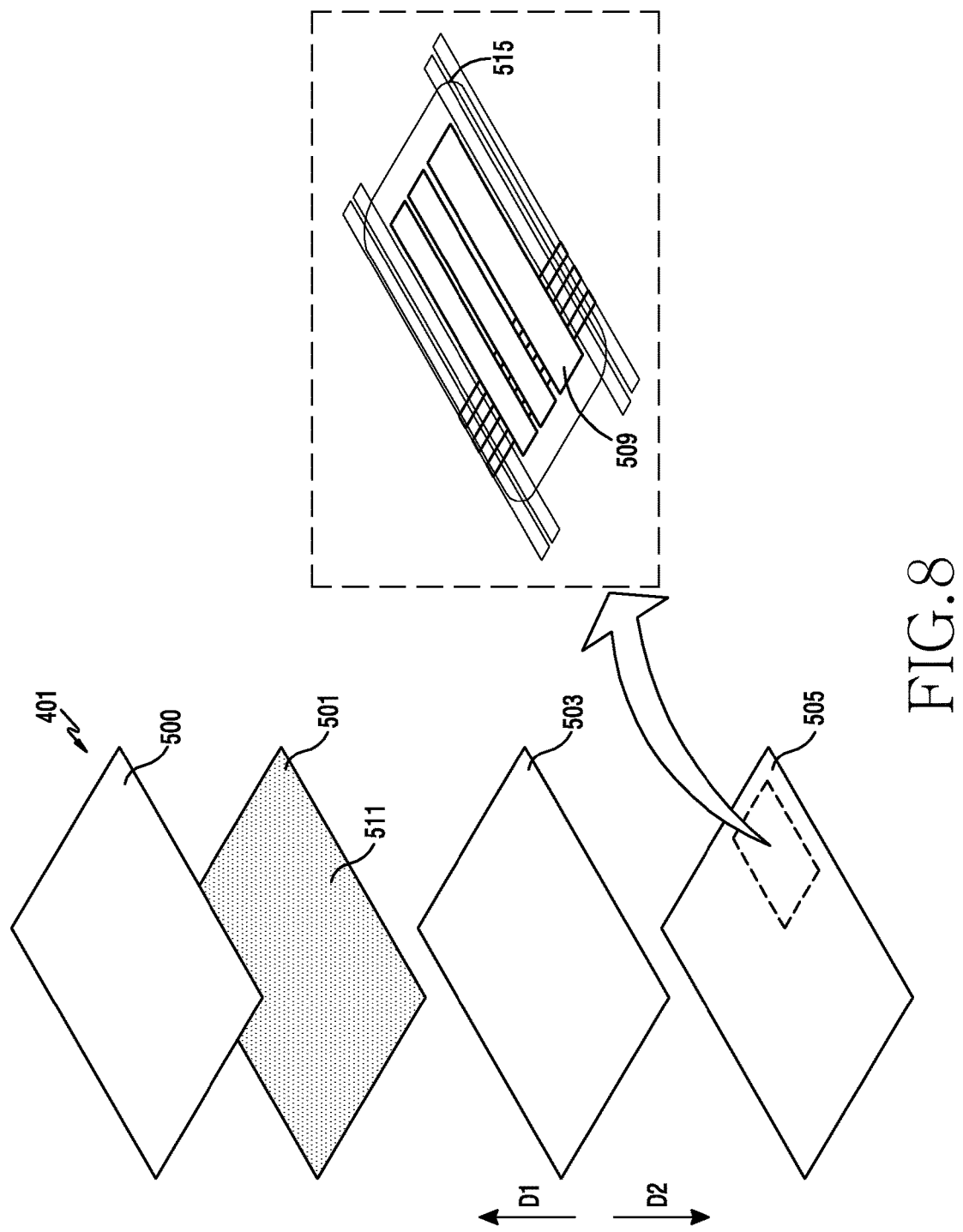
FIG. 8 is an exploded perspective view of illustrating an example display apparatus according to various example embodiments of the present disclosure.

FIG. 8 is an exploded perspective view illustrating an example display apparatus according to various example embodiments of the present disclosure.

As illustrated in FIG. 8, according to various example embodiments of the present disclosure, the polarizing layer 501 included in the display apparatus 401 may include the color layer 511. The color layer 511 may be separately formed on the polarizing layer 501. Alternatively, the polarizing layer 501 may include a color, and thereby, the color layer 511 and the polarizing layer 501 may be formed as an identical layer. For example, the polarizing layer 501 may be a dye-based type polarizing layer 501. In the present example, a color may be implemented in the polarizing layer 501 by blending dichroic dye. Alternatively, a color may be implemented in the polarizing layer 501 by blending various dyes together.

Meanwhile, although not illustrated in the drawings, various example embodiments of the present disclosure may be described as including the above-described pattern-formation layer. The pattern-formation layer may include lenses having various shapes. Alternatively, the pattern-formation layer may include a fine particle material, metal powder, beads, or the like. The pattern-formation layer may be disposed on the polarizing layer 501. Alternatively, the pattern-formation layer may be disposed at various locations within the display apparatus 401. A texture expression may be added to a color, which is represented by the polarizing layer 501, through the pattern-formation layer.

Figure 9:
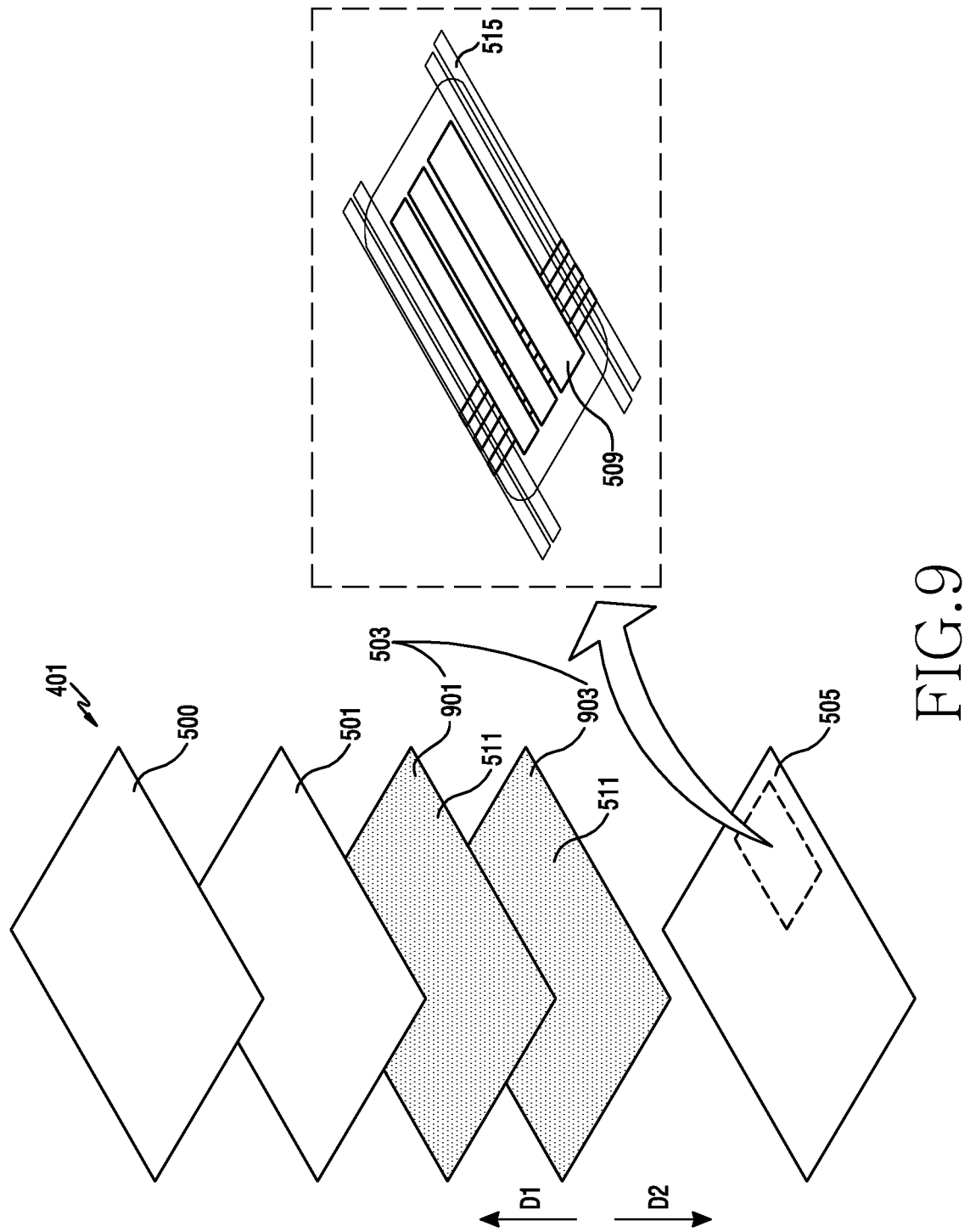
FIG. 9 is an exploded perspective view illustrating an example display apparatus according to various example embodiments of the present disclosure.

FIG. 9 is an exploded perspective view illustrating an example display apparatus according to various example embodiments of the present disclosure.

As illustrated in FIG. 9, according to various example embodiments of the present disclosure, the phase difference layer 503 included in the display apparatus 401 may include the color layer 511. The color layer 511 may be separately formed on the phase difference layer 503. Alternatively, the phase difference layer 503 may include a color, and thereby, the color layer 511 and the phase difference layer 503 may be formed as an identical layer. According to various embodiments of the present disclosure, a color may be implemented by changing a physical property of the phase difference layer 503. For example, the phase difference layer 503 may implement a desired color through the adjustment of a phase difference value for each wavelength.

Alternatively, the phase difference layer 503 may include a first phase difference layer 901 and a second phase difference layer 903. The first and second phase difference layers 901 and 903 may be disposed to have different angles. A color may be implemented by changing an angle between the first and second phase difference layers 901 and 903.

According to various example embodiments of the present disclosure, a color may be implemented by deriving light leakage through the phase difference layer 503. For example, a color such as, for example, and without limitation, topaz blue, gold, blue, or the like may be implemented through the phase difference layer 503.

Meanwhile, although not illustrated in the drawings, various example embodiments of the present disclosure may be described as including the above-described pattern-formation layer. The pattern-formation layer may include, without limitation, lenses having various shapes. Alternatively, the pattern-formation layer may include, without limitation, a fine particle material, metal powder, beads, or the like. The pattern-formation layer may be disposed on the phase difference layer 503. Alternatively, the pattern-formation layer may be disposed at various locations within the display apparatus 401. A texture expression may be added to a color, which is represented by the phase difference layer 503, through the pattern-formation layer.

Figure 10:
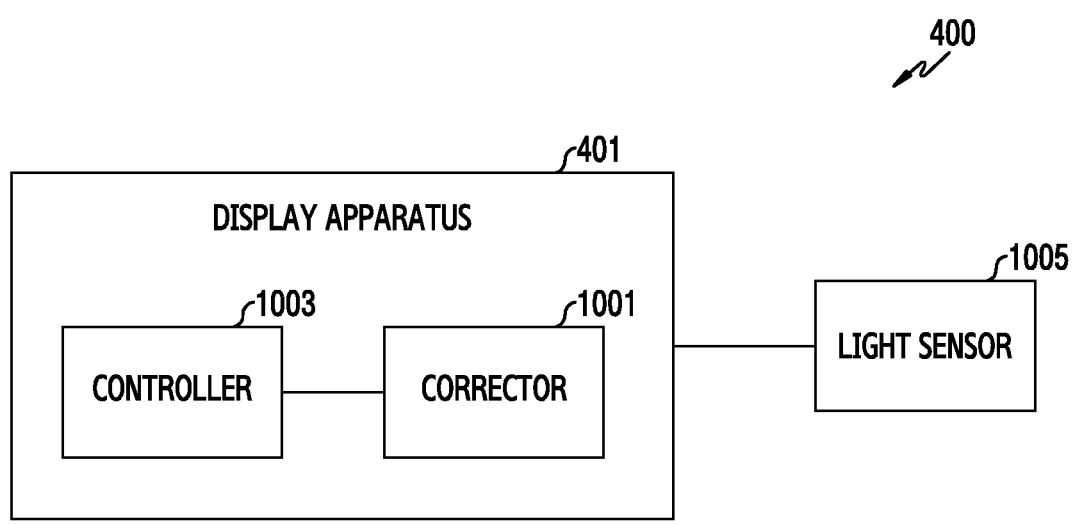
FIG. 10 is a block diagram illustrating an example configuration of a display apparatus according to various example embodiments of the present disclosure.

FIG. 10 is a block diagram illustrating an example configuration of a display apparatus according to various example embodiments of the present disclosure.

The display apparatus 401 according to various example embodiments of the present disclosure as illustrated in FIG. 10 may be applied to a case where the polarizing layer 501 or the phase difference layer 503 includes a color as in the embodiment illustrated in FIG. 8 or 9.

As illustrated in FIG. 10, the display apparatus 401 according to various embodiments of the present disclosure may include a corrector (e.g., including correction circuitry) 1001 and a controller (e.g., including processing circuitry) 1003. A light sensor 1005 may be included within the display apparatus 401. Alternatively, as illustrated in FIG. 10, the light sensor 1005 may be included outside of the display apparatus 401, and may be functionally connected to the display apparatus 401. The light sensor 1005 may be the illuminance sensor 240K described above with reference to FIG. 2. The display apparatus 401 and the illuminance sensor 240K may comprise the electronic device 201 illustrated in FIG. 2. The light sensor 1005 may sense an ambient illuminance. For example, the light sensor 1005 may sense the amount of ambient light. The corrector 1001 may include various circuitry and/or program elements configured to correct a pixel value on the basis of the illuminance sensed by the light sensor 1005. The corrector 1001 may output correction values of respective pixels of red (R), green (G), and blue (B) depending on an ambient illuminance. For example, the corrector 1001 may store a table of correction values of respective pixels depending on an ambient illuminance, and may determine designated values.

The controller 1003 may be functionally connected to the light sensor 1005 and the corrector 1001. The controller 1003 may include various processing circuitry and control an overall operation of the display apparatus 401. The controller 1003 may receive a determined correction value from the corrector 1001. The controller 1003 may control the light-emitting elements 521 to be capable of emitting light according to correction values depending on an ambient illuminance. For example, the controller 1003 may control the light-emitting elements 521 to be capable of emitting light of red (R), green (G), and blue (B) according to the changed values. Meanwhile, the controller 1003 may be configured within the display apparatus 401, or may be configured outside of the display apparatus 401. The controller 1003 may be an element corresponding to the processor 210 described with reference to FIG. 2.

A display apparatus according to various example embodiments of the present disclosure may include: a window layer 500 configured to form at least one outward appearance of the display apparatus 401; a pixel layer 505 including at least one pixel 509 configured to display graphic information received through a processor 210 that is functionally connected to the display apparatus 401, a driving wiring 515 that drives the pixel 509, and a Black Matrix (BM) area that does not include the at least one pixel 509; and a color layer 511 configured to be disposed in at least one direction of the pixel layer 505, and to to allow a designated color to be exposed to an outside through the window layer 500 when the at least one pixel 509 does not operate, wherein the pixel layer 505 may include: a first substrate 525 including a first plane facing a first direction D1, and a second plane facing a second direction D2 opposite to the first direction D1; and a pixel electrode 513, a light-emitting element 521, a cathode 519, and a second substrate 517 disposed between the first plane of the first substrate 525 and the window layer 500, and wherein the color layer 511 may be configured to be disposed in the BM area.

In the display apparatus according to various example embodiments of the present disclosure, the pixel layer 505 may include: a first area 505a in which the pixel 509 is disposed; and a second area 505b which is disposed adjacent to the first area 505a, and in which the color layer 511 is disposed.

In the display apparatus according to various example embodiments of the present disclosure, the first area 505a and the second area 505b may be configured to be alternately disposed.

In the display apparatus according to various example embodiments of the present disclosure, the color layer 511 may further include a pattern-formation layer 701 configured to refract light reflected by the color layer 511.

In the display apparatus according to various example embodiments of the present disclosure, the pattern-formation layer 701 may include at least one of a lens, a fine particle material, metal powder, and a bead.

In the display apparatus according to various example embodiments of the present disclosure, the display apparatus 401 may further include a touch screen including a pressure sensor.

In the display apparatus according to various example embodiments of the present disclosure, the color layer 511 may include a first color area 1101 and a second color area 1103 having different light characteristics.

In the display apparatus according to various example embodiments of the present disclosure, the display apparatus 401 may further include a polarizing layer 501 configured to be disposed in the first direction D1 of the first substrate 525, wherein the polarizing layer 501 may include the color layer 511.

In the display apparatus according to various example embodiments of the present disclosure, the display apparatus 401 may further include a phase difference layer 503 configured to be disposed in the first direction D1 of the first substrate 525, wherein the phase difference layer 503 may include the color layer 511.

In the display apparatus according to various example embodiments of the present disclosure, the pixel 509 may be configured to output a corrected pixel according to an ambient illuminance.

A display apparatus according to various example embodiments of the present disclosure may include: a window layer 500 configured to form at least one outward appearance of the display apparatus 401; a pixel layer 505 including at least one pixel 509 configured to display graphic information received through a processor 210 that is functionally connected to the display apparatus 401; and a color layer 511 configured to be disposed in at least one direction of the pixel layer 505, and to allow a designated color to be exposed to an outside through the window layer 500 when the at least one pixel 509 does not operate.

In the display apparatus according to various example embodiments of the present disclosure, the pixel layer 505 may include a Black Matrix (BM) area that does not include the at least one pixel 509, and the color layer 511 may be configured to be disposed in the BM area.

In the display apparatus according to various example embodiments of the present disclosure, the pixel layer 505 may include: a first substrate 525 including a first plane facing a first direction D1, and a second plane facing a second direction D2 opposite to the first direction D1; and a pixel electrode 513, a light-emitting element 521, and a cathode 519 configured to be disposed between the first plane of the first substrate 525 and the window layer 500.

In the display apparatus according to various example embodiments of the present disclosure, the color layer 511 may further include a pattern-formation layer 701 configured to refract light reflected by the color layer 511.

In the display apparatus according to various example embodiments of the present disclosure, the pattern-formation layer 701 may include at least one of a lens, a fine particle material, metal powder, and a bead.

In the display apparatus according to various example embodiments of the present disclosure, the display apparatus 401 may further include a touch screen including a pressure sensor.

An electronic device according to various example embodiments of the present disclosure may include: a display apparatus 401; and a processor 210 configured to be functionally connected to the display apparatus 401, wherein the display apparatus may include: a window layer 500 configured to form at least one outward appearance of the display apparatus 401; a pixel layer 505 including at least one one pixel 509 configured to display graphic information received through the processor 210 that is functionally connected to the display apparatus 401; and a color layer 511 configured to be disposed in at least one direction of the pixel layer 505, and to allow a designated color to be exposed to an outside through the window layer 500 when the at least one pixel 509 does not operate, wherein the color layer 511 may further include a pattern-formation layer 701 configured to refract light reflected by the color layer 511, wherein the pattern-formation layer 701 may include at least one of a lens, a fine particle material, metal powder, and a bead.

In the electronic device according to various example embodiments of the present disclosure, the processor 210 may be configured to control the pixel 509 to output a corrected pixel according to an ambient illuminance.

Figure 11:
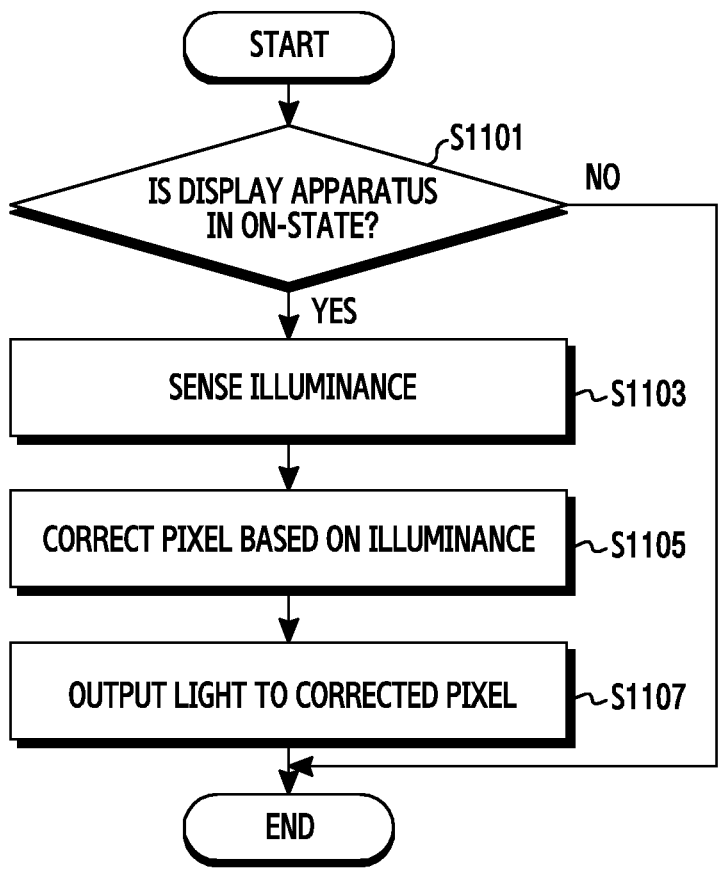
FIG. 11 is a flowchart illustrating an example operation of a display apparatus according to various example embodiments of the present disclosure.

FIG. 11 is a flowchart illustrating an example operation of a display apparatus according to various example embodiments of the present disclosure.

As illustrated in FIG. 11, in operation S1101, the controller 1003 may sense (determine) an on-state of the display apparatus 401. Alternatively, the controller 1003 may sense an on-state of the light-emitting element 521. The controller 1003 may sense whether the display apparatus 401 operates.

In operation S1103, the light sensor 1005 may sense an ambient illuminance. The light sensor 1005 may sense the amount of ambient light. In operation S1105, the corrector 1001 may receive the sensed ambient illuminance from the light sensor 1005. The corrector 1001 may correct a pixel based on the received illuminance. At this time, the correction of a pixel may be a color correction, a brightness correction, or the like. The corrector 1001 may output a designated value using a table of correction values of the respective pixels depending on an ambient illuminance. In operation S1107, the controller 1003 may control the light-emitting element 521 to output light to the corrected pixel. For example, according to various example embodiments of the present disclosure, a pixel value may be changed and be output based on a characteristic of a color depending on an ambient illuminance.

Figure 12B:
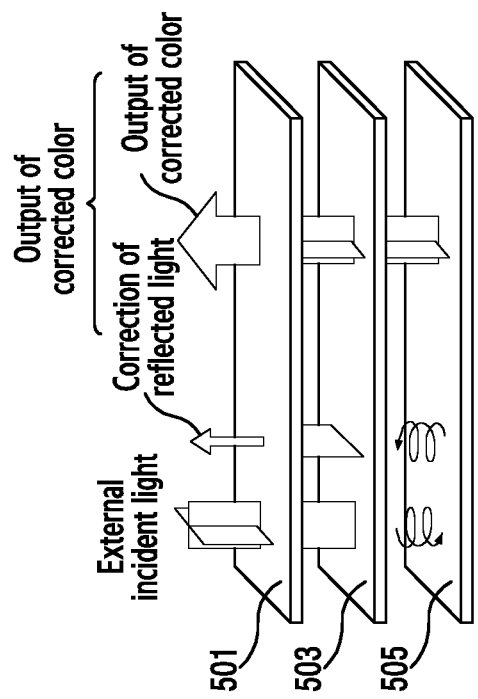
FIGS. 12A and 12B are diagrams illustrating an example operation of a display apparatus according to various example embodiments of the present disclosure.
Figure 12A:
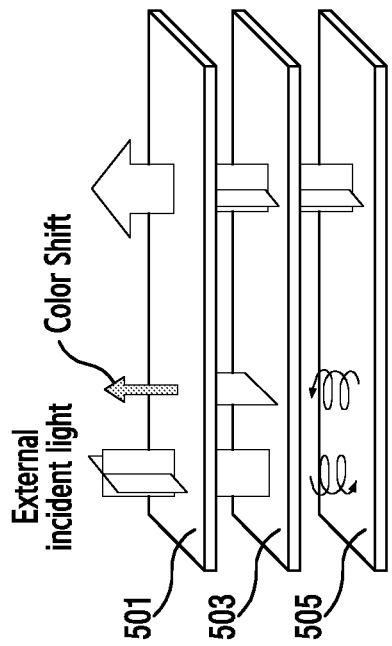

FIGS. 12A and 12B are diagrams illustrating an example operation of a display apparatus according to various example embodiments of the present disclosure.

In various example embodiments of the present disclosure, as in the embodiment illustrated in FIG. 8 or 9, when the polarizing layer 501 or the phase difference layer 503 includes a color, it is possible to correct a color distortion between output light, which is output from the pixel layer 505, and external incident light which is incident from the outside. For example, as illustrated in FIG. 12A, when the polarizing layer 501 or the phase difference layer 503 includes a color, with respect to external incident light which is incident from the outside and is reflected by the pixel layer 505, a color shift phenomenon may occur according to an ambient illuminance. For example, in a case where external incident light is incident to the pixel layer 505, when the external incident light is first polarized through the polarizing layer 501 and is then reflected by the pixel layer 505, a color shift phenomenon may occur as the external incident light passes through the phase difference layer 503. For example, as the intensity of a color reflected by the polarizing layer 501 becomes stronger according to an increase in an ambient illuminance, the balance of the color may become different. Accordingly, a color distortion may occur between the output light, which is output from the pixel layer 505, and the external incident light. However, as illustrated in FIG. 12B, according to various embodiments of the present disclosure, a pixel may be corrected according to an ambient illuminance, and thereby, the color distortion may be corrected. Therefore, the degradation of a screen displayed by the display apparatus 401 can be prevented and/or reduced.

Figure 13C:
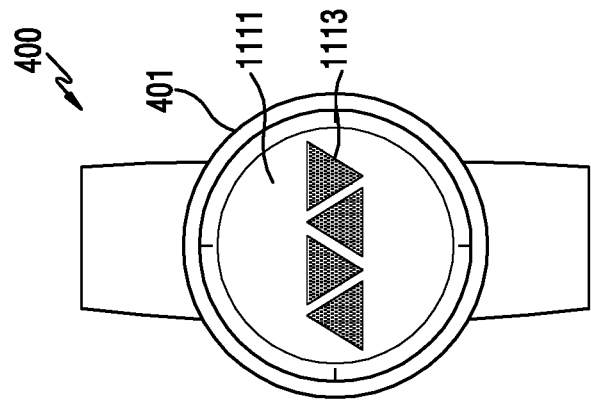
FIGS. 13A, 13B and 13C are diagrams illustrating example front views of a display apparatus according to various example embodiments of the present disclosure.
Figure 13B:
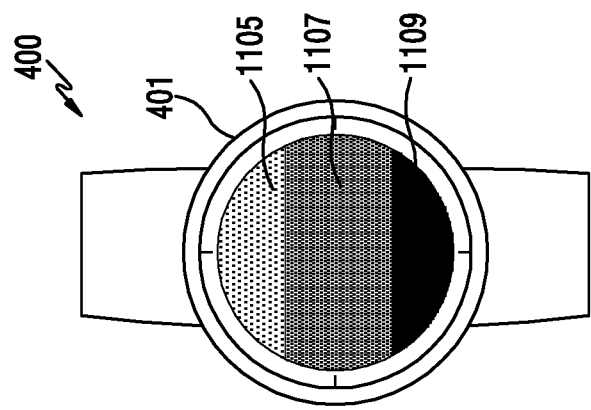
Figure 13A:
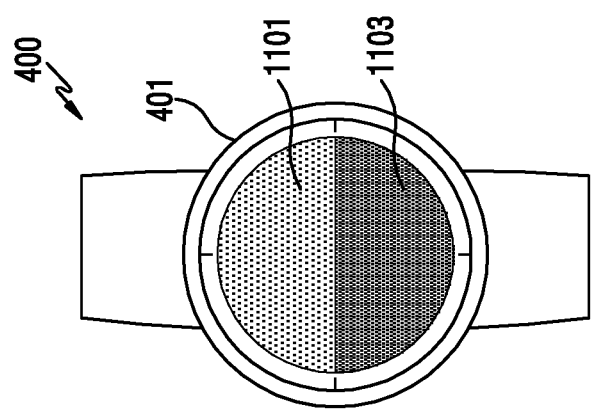

FIGS. 13A, 13B and 13C are diagrams illustrating example front views of a display apparatus according to various example embodiments of the present disclosure.

As illustrated in FIG. 13A, the display apparatus 401 according to various example embodiments of the present disclosure may include a first color area 1101 and a second color area 1103. For example, the color layer 511 included in the display apparatus 401 may include the first color area 1101 and the second color area 1103. The first and second color areas 1101 and 1103 may have different light characteristics. For example, the first and second color areas 1101 and 1103 may have, without limitation, different reflectivities, colors, transmittances, or the like. Alternatively, as illustrated in FIG. 13B, the display apparatus 401 according to various example embodiments of the present disclosure may include a third color area 1105, a fourth color area 1107, and a fifth color area 1109. The third, fourth, and fifth color areas 1105, 1107, and 1109 may, for example, have different light characteristics. For example, the third, fourth, and fifth color areas 1105, 1107, and 1109 may, without limitation, have different reflectivities, colors, transmittances, or the like. Alternatively, as illustrated in FIG. 13C, the display apparatus 401 may include a sixth color area 1111 and a seventh color area 1113. The seventh color area 1113 may include a pattern. The seventh color area 1113 may include a particular shape. For example, as illustrated in FIG. 13C, the seventh color area 1113 may include, for example, a triangular shape.

Figure 14:
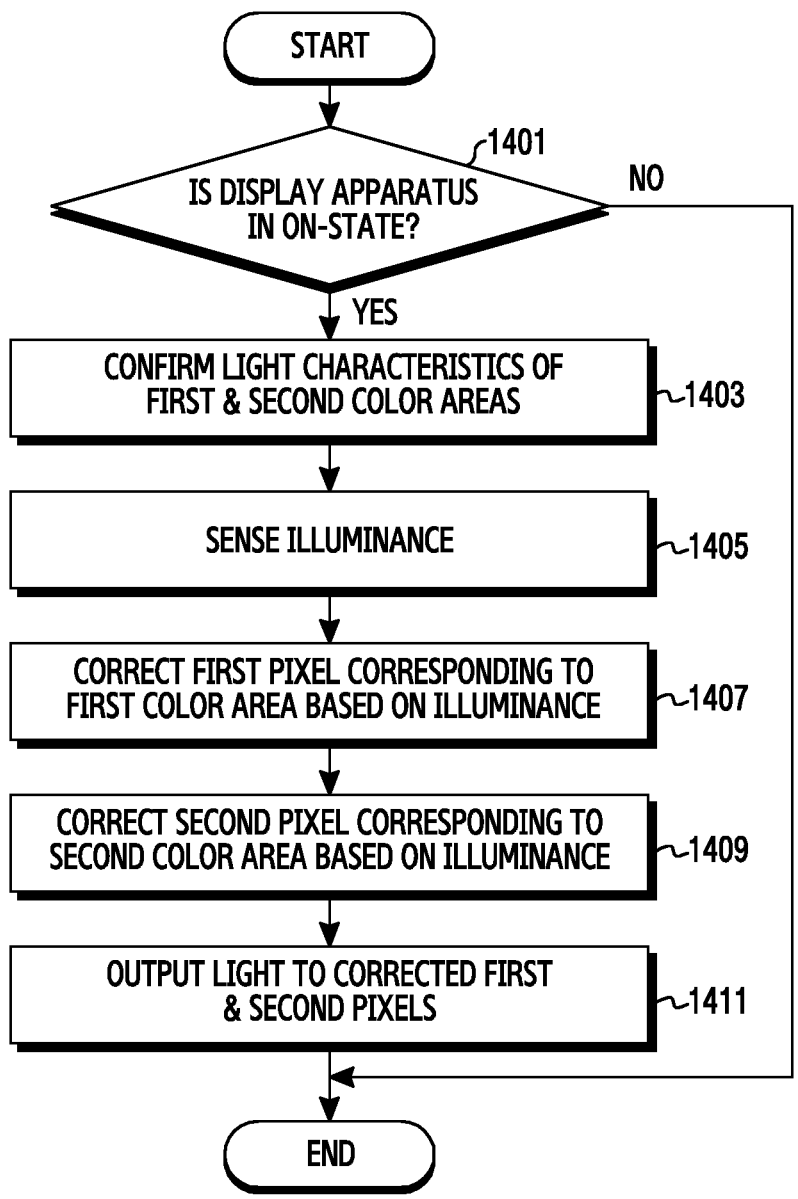
FIG. 14 is a flowchart illustrating an example operation of a display apparatus according to various example embodiments of the present disclosure.

FIG. 14 is a flowchart illustrating an example operation of a display apparatus according to various example embodiments of the present disclosure.

As illustrated in FIGS. 10 and 14, in operation 1401, the controller 1003 may sense (determine) an on-state of the display apparatus 401. Alternatively, the controller 1003 may sense an on-state of the light-emitting element 521. The controller 1003 may sense whether the display apparatus 401 operates.

In operation 1403, the controller 1003 may confirm light characteristics of the first color area 1101 and the second color area 1103. The controller 1003 may confirm, for example, reflectivities, colors, transmittances, or the like of the first and second color areas 1101 and 1103. Meanwhile, according to various embodiments of the present disclosure, the light characteristics of the first and second color areas 1101 and 1103 may be previously confirmed and stored. Accordingly, operation 1401 may be omitted.

In operation 1405, the light sensor 1005 may sense an ambient illuminance. The light sensor 1005 may sense the amount of ambient light.

In operation 1407, the corrector 1001 may receive the sensed ambient illuminance from the light sensor 1005. Also, in operation 1407, the corrector 1001 may correct a first pixel, that corresponds to the first color area 1101, on the basis of the received illuminance. The correction of the first pixel may be a color correction, a brightness correction, or the like. For example, the corrector 1001 may correct the first pixel of the light-emitting element 521 corresponding to the first color area 1101. The corrector 1001 may output a designated value using a table of correction values of the respective pixels depending on an ambient illuminance. Similarly to this configuration, in operation 1409, the corrector 1001 may correct a second pixel that corresponds to the second color area 1103, on the basis of the received illuminance. At this time, the correction of the second pixel may be a color correction, a brightness correction, or the like. For example, the corrector 1001 may correct the second pixel of the light-emitting element 521 corresponding to the second color area 1103. The corrector 1001 may output a designated value by using a table of correction values of the respective pixels depending on an ambient illuminance.

In operation 1411, the controller 1003 may control the light-emitting element 521 to output light to the corrected pixels. For example, in operation 1411, the controller 1003 may control the light-emitting element 521 that corresponds to the first color area 1101, to emit light to the corrected first pixel. In operation 1411, the controller 1003 may control the light-emitting element 521 that corresponds to the second color area 1103, to emit light to the corrected second pixel.

For example, the first and second pixels may be corrected according to different reflectivities of the first and second color areas 1101 and 1103. When the first color area has a first reflectivity (e.g., 5%) and the second color area has a second reflectivity (e.g., 7%), in response to the sensed ambient illuminance (e.g., 6,000 lux), the brightness of the first pixel corresponding to the first color area 1101 may be corrected to a first correction value (e.g., 30), the brightness of the second pixel corresponding to the second color area 1103 may be corrected to a second correction value (e.g., 50), and the first and second correction values may be output.

Alternatively, in response to the sensed ambient illuminance (e.g., 30,000 lux), the brightness of the first pixel corresponding to the first color area 1101 may be corrected to a third correction value (e.g., 150), the brightness of the second pixel corresponding to the second color area 1103 may be corrected to a fourth correction value (e.g., 350), and the third and fourth correction values may be output.

For example, according to various example embodiments of the present disclosure, a pixel value depending on an ambient illuminance may be corrected according to a light characteristic of each color area, and thereby, may be compensated.

A method of operating a display apparatus according to various example embodiments of the present disclosure may include: sensing an illuminance; correcting a pixel of a light-emitting element 521 based on the sensed illuminance; and outputting light to the corrected pixel, wherein a color layer 511 configured to be disposed in at least one direction and to have a predetermined color corresponding to the light-emitting elements 521 may be included.

In the method of operating the display apparatus according to various example embodiments of the present disclosure, when the color layer 511 includes a first color area 1101 and a second color area 1103 having different light characteristics, the correcting of the pixel may include: correcting a first pixel of the light-emitting element 521 corresponding to the first color area 1101, and correcting a second pixel of the light-emitting element 521 corresponding to the second color area 1103.

In various example embodiments of the present disclosure, the display apparatus, that is capable of having a determined color when the display apparatus is in an on-state or off-state, can be implemented. For example, the display apparatus may have a color even in a state of not being driven, and accordingly, can ensure a superior outward appearance design. Alternatively, the display apparatus may display a color even when an operation of the display apparatus is in an off-state, and accordingly, can improve an aesthetic impression. According to various embodiments of the present disclosure, the display apparatus can represent a color, such as, without limitation, white, gold, silver, blue, deep blue, topaz blue, wine, purple, or the like.

While various example embodiments of the present disclosure have been illustrated and described herein, it will be understood that the various examples are intended to be illustrative and not limiting. As such, one or ordinary skill in the art will understand that various modifications, alternatives and variations in the example embodiments may be realized and fall within the true spirit and full scope of the present disclosure as reflected in the appended claims and their equivalents.

What is claimed is:

1. A display apparatus comprising:
 a window layer configured to contribute to at least one outward appearance of the display apparatus;
 a first substrate that is disposed under the window layer, and including a plurality of pixel electrodes facing the window layer;
 a pixel layer that is disposed between the first substrate and the window layer and includes:
 a plurality of pixels respectively disposed on the plurality of pixel electrodes, wherein each of the plurality of pixels is configured to emit a light; and
 color regions disposed between the plurality of pixels, wherein each of the color regions has a color distinct from a black color, and the color is exposed to an outside through the window layer when the plurality of pixels do not operate.

2. The display apparatus as claimed in claim 1, wherein the pixel layer comprises:
 a first area in which one of the plurality of pixels is disposed; and
 a second area adjacent to the first area, wherein one of the plurality of color regions is disposed in the second area.

3. The display apparatus as claimed in claim 2, wherein the first area and the second area are alternately disposed.

4. The display apparatus as claimed in claim 1, wherein the plurality of color regions further comprises a plurality of pattern-formation layer configured to refract the light reflected by the color layer.

5. The display apparatus as claimed in claim 4, wherein the plurality of pattern-formation layer comprises at least one of: a lens, a fine particle material, metal powder, and a bead.

6. The display apparatus as claimed in claim 1, wherein the display apparatus further comprises a touch screen including a pressure sensor.

7. The display apparatus as claimed in claim 1, wherein each of the plurality of color regions comprises a first color area and a second color area, each of the first and second color areas having different light characteristics.

8. The display apparatus as claimed in claim 1, wherein the display apparatus further comprises a polarizing layer disposed between the first substrate and the window layer includes the plurality of color regions.

9. The display apparatus as claimed in claim 1, wherein the display apparatus further comprises a phase difference layer disposed between the first substrate and the window layer and includes the color layer.

10. The display apparatus as claimed in claim 1, wherein each of the pixels is configured to output a corrected pixel based on an ambient illuminance.

11. A display apparatus comprising:
 a window layer configured to contribute to at least one outward appearance of the display apparatus;
 a pixel layer that is disposed under the window layer and includes:
 a plurality of pixels configured to display graphic information received from a processor that is functionally connected to the display apparatus; and
 color regions disposed between the plurality of pixels, wherein each of the color regions has a color distinct from a black color, and the color is exposed to an outside through the window layer when the plurality of pixels do not operate.

12. The display apparatus as claimed in claim 11, wherein the pixel layer comprises a Black Matrix (BM) disposed in BM area that does not include the plurality of pixels, and the color regions are is disposed in the BM area.

13. The display apparatus as claimed in claim 11, wherein the pixel layer comprises:
 a first substrate including a first plane facing a first direction, and a second plane facing a second direction opposite the first direction; and a pixel electrode, a light-emitter, and a cathode disposed between the first plane of the first substrate and the window layer.

14. The display apparatus as claimed in claim 11, wherein each of the plurality of color regions further comprises a pattern-formation layer configured to refract light reflected by the color layer.

15. The display apparatus as claimed in claim 14, wherein the pattern-formation layer comprises at least one of: a lens, a fine particle material, metal powder, and a bead.

16. The display apparatus as claimed in claim 11, wherein the display apparatus further comprises a touch screen including a pressure sensor.

17. An electronic device comprising:
a display apparatus; and
a processor functionally connected to the display apparatus,
wherein the display apparatus comprises:
a window layer configured to contribute to at least one outward appearance of the display apparatus;
a pixel layer that is disposed under the window layer and includes:
a plurality of pixels configured to display graphic information received from the processor that is functionally connected to the display apparatus; and
color regions disposed between the plurality of pixels, wherein each of the color regions has a color distinct from a black color, and the color is exposed to an outside through the window layer when the plurality of pixels do not operate,
wherein each of the plurality of color regions further comprises a pattern-formation layer configured to refract the light reflected by the color layer,
wherein the pattern-formation layer comprises at least one of: a lens, a fine particle material, metal powder, and a bead.

18. The electronic device as claimed in claim 17, wherein the processor is configured to control at least one of the plurality of pixels to output a corrected pixel based on an ambient illuminance.

19. The display apparatus as claimed in claim 11, further comprising:
a processor operatively coupled to the pixel layer and the plurality of color regions,
wherein the processor is configured to:
sense an illuminance;
correct the plurality of pixels based on the sensed illuminance; and
output light to the corrected plurality of pixels.

20. The method as claimed in claim 19, wherein, when each of the plurality of color regions comprises a first color area and a second color area, each of the first and second color areas having different light characteristics,
wherein the processor, to correct the at least one of the plurality of pixels, is configured to:
correct a first pixel of the pixels corresponding to the first color area, and correct a second pixel of the pixels corresponding to the second color area.

* * * * *